(12) United States Patent
Bang et al.

(10) Patent No.: US 12,295,233 B2
(45) Date of Patent: May 6, 2025

(54) DISPLAY DEVICE

(71) Applicant: Samsung Display Co., Ltd., Yongin-si (KR)

(72) Inventors: Kiho Bang, Hwaseong-si (KR); Yeri Jeong, Suwon-si (KR); Wonjun Choi, Seoul (KR); Eunhye Kim, Namyangju-si (KR); Il-Joo Kim, Hwaseong-si (KR); Eunae Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 553 days.

(21) Appl. No.: 17/661,877

(22) Filed: May 3, 2022

(65) Prior Publication Data

US 2023/0057306 A1 Feb. 23, 2023

(30) Foreign Application Priority Data

Aug. 17, 2021 (KR) .................. 10-2021-0108190

(51) Int. Cl.
*H01L 27/32* (2006.01)
*G06F 3/044* (2006.01)
*H10K 59/131* (2023.01)
*H10K 59/40* (2023.01)
*H10K 102/00* (2023.01)

(52) U.S. Cl.
CPC .......... *H10K 59/40* (2023.02); *G06F 3/0446* (2019.05); *H10K 59/131* (2023.02); *G06F 2203/04111* (2013.01); *H10K 2102/311* (2023.02)

(58) Field of Classification Search
None
See application file for complete search history.

(56) References Cited

U.S. PATENT DOCUMENTS

| 10,768,742 | B2  |   | 9/2020 | Rhe et al. |
| 12,099,678 | B2  | * | 9/2024 | Jeong .................. G06F 3/0412 |
| 2015/0085456 | A1 | * | 3/2015 | Cok .................... H05K 1/0274 |
|  |  |  |  | 174/253 |
| 2021/0149524 | A1 |   | 5/2021 | Bang |

FOREIGN PATENT DOCUMENTS

| KR | 10-2017-0080285 A | 7/2017 |
| KR | 10-2019-0047549 A | 5/2019 |
| KR | 10-2021-0059833 A | 5/2021 |

* cited by examiner

*Primary Examiner* — Robert K Carpenter
(74) *Attorney, Agent, or Firm* — Womble Bond Dickinson (US) LLP

(57) ABSTRACT

A display device includes: a display panel including a pixel; and an input sensor on the display panel. The input sensor includes: sensing electrodes; and sensing lines including: a multi-layered area including a first trace line and a second trace line, the first and second trace lines being connected to the sensing electrodes and located at different layers from each other; a single-layer area including a first area and a second area; a first line including the first trace line in the first area, and the second trace line connected to the first trace line in the second area; and a second line adjacent to the first line, the second line including the second trace line in the first area, and the first trace line connected to the second trace line in the second area.

20 Claims, 14 Drawing Sheets

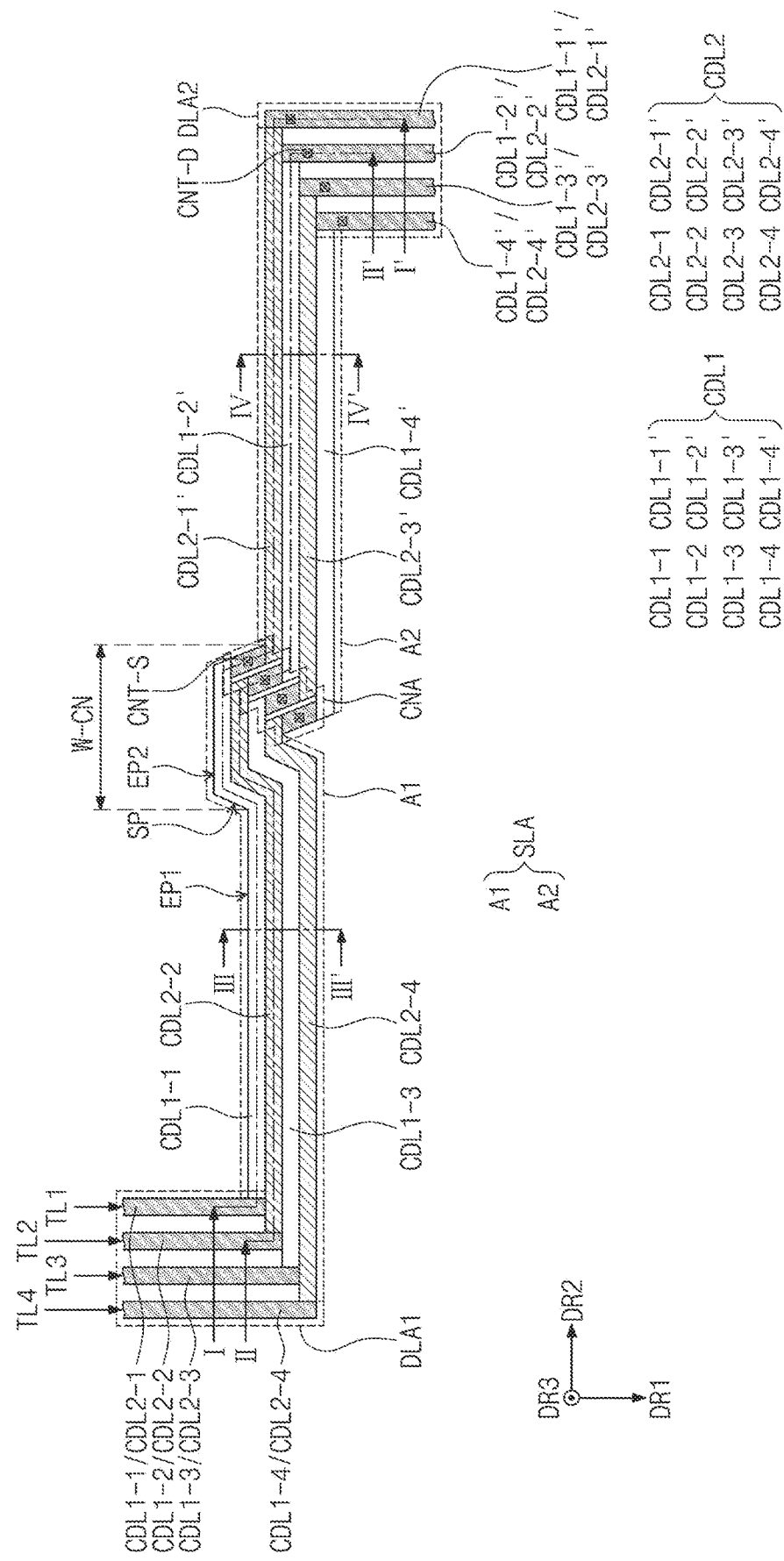

DISPLAY DEVICE

CROSS-REFERENCE TO RELATED APPLICATION

This application claims priority to and the benefit of Korean Patent Application No. 10-2021-0108190, filed on Aug. 17, 2021, the entire content of which is incorporated by reference herein.

BACKGROUND

1. Field

Aspects of one or more embodiments of the present disclosure relate to a display device. More particularly, aspects of one or more embodiments of the present disclosure relate to a display device with improved sensing reliability.

2. Description of the Related Art

Electronic devices for providing images to a user may include a display device to display the images. Such electronic devices may include, for example, smartphones, digital cameras, notebook computers, navigation units, televisions, and the like. The display device includes a display panel for generating and displaying the images, and an input device, for example, such as a keyboard, a mouse, an input sensor, and/or the like.

The input sensor is disposed on the display panel, and generates an input signal when the user touches a touch panel. The input signal generated by the touch panel is applied to the display panel, and the display panel provides images corresponding to the input signal to the user, in response to the input signal applied thereto from the touch panel.

The above information disclosed in this Background section is for enhancement of understanding of the background of the present disclosure, and therefore, it may contain information that does not constitute prior art.

SUMMARY

One or more embodiments of the present disclosure are directed to a display device with a reduced bezel width.

One or more embodiments of the present disclosure are directed to a display device with improved sensing reliability.

According to one or more embodiments of the present disclosure, a display device includes: a display panel including a pixel; and an input sensor on the display panel. The input sensor includes: sensing electrodes; and sensing lines including: a multi-layered area including a first trace line and a second trace line, the first and second trace lines being connected to the sensing electrodes and located at different layers from each other; a single-layer area including a first area and a second area; a first line including the first trace line in the first area, and the second trace line connected to the first trace line in the second area; and a second line adjacent to the first line, the second line including the second trace line in the first area, and the first trace line connected to the second trace line in the second area.

In an embodiment, a length of the first line in the first area may be equal to a length of the first line in the second area, and a length of the second line in the first area may be equal to a length of the second line in the second area.

In an embodiment, the display panel may include: a first non-bending area including the pixel; a bending area; and a second non-bending area. The first non-bending area, the bending area, and the second non-bending area may be arranged along a first direction, and the bending area may be configured to be bent relative to an imaginary axis extending in a second direction crossing the first direction.

In an embodiment, the single-layer area may overlap with the first non-bending area.

In an embodiment, the sensing lines may further include a connection area connecting the first area and the second area to each other, and the first trace line may overlap with the second trace line in the connection area.

In an embodiment, portions of the first trace line and the second trace line that overlap with each other in the connection area may each have a parallelogram shape.

In an embodiment, at the connection area, the first trace line of the first line in the first area may be connected to the second trace line of the first line in the second area.

In an embodiment, at the connection area, the second trace line of the second line in the first area may be connected to the first trace line of the second line in the second area.

In an embodiment, the connection area may extend in an oblique direction with respect to a direction in which the first and second lines extend in the second area.

In an embodiment, each of the first and second trace lines may include: a first extension portion extending in one direction, and connected to the multi-layered area in the first area; a second extension portion extending in the one direction, and connected to the connection area in the first area; and an inclination portion extending in an oblique direction with respect to the one direction, and located between the first extension portion and the second extension portion. The first extension portion of the second line may be aligned with the second area of the first line in the one direction.

In an embodiment, sensing lines overlapping with the first area from among the sensing lines may overlap with the first non-bending area of the display panel, and sensing lines overlapping with the second area from among the sensing lines may be spaced from the first area with the bending area interposed therebetween, and may overlap with the second non-bending area.

In an embodiment, the display panel may include: a bridge line located in the bending area; a first input contact hole exposing one end of the bridge line adjacent to the first non-bending area; and a second input contact hole exposing another end of the bridge line adjacent to the second non-bending area. The sensing lines overlapping with the first area may be connected to the one end of the bridge line via the first input contact hole, and the sensing lines overlapping with the second area may be connected to the other end of the bridge line via the second input contact hole.

In an embodiment, the first area may overlap with the first non-bending area, and at least a portion of the first area may not overlap with the bending area in the first direction.

In an embodiment, the multi-layered area may include a plurality of multi-layered areas, and the single-layer area may be located between the plurality of multi-layered areas.

In an embodiment, the input sensor may include: a first sensing insulating layer on the display panel; a first sensing conductive layer on the first sensing insulating layer, and including the first trace line; a second sensing insulating layer on the first sensing insulating layer to cover the first sensing conductive layer; and a second sensing conductive layer on the second sensing insulating layer, and including the second trace line.

In an embodiment, each of the first trace line and the second trace line may have a trapezoidal shape in a cross-sectional view.

In an embodiment, the first trace line of the first line may not overlap with the second trace line of the second line in the first area, and the second trace line of the first line may not overlap with the first trace line of the second line in the second area.

In an embodiment, a distance between the first trace line of the first line and the second trace line of the second line in the single-layer area may be less than or equal to about 2 micrometers in a cross-sectional view.

In an embodiment, an end of the first trace line of the first line may be aligned with an end of the second trace line of the second line in the single-layer area in a plan view.

In an embodiment, the first trace line may have a width greater than a width of the second trace line in a cross-sectional view, and the first trace line may have a thickness smaller than a thickness of the second trace line in the cross-sectional view.

According to one or more embodiments of the present disclosure, portions of the sensing lines arranged in the input sensor may include the single-layer area in which one of the two conductive layers disposed on different layers from each other is disposed, and thus, the width of the sensing layers in an arrangement direction may decrease. Thus, a bezel width of the display device may be reduced.

In addition, according to one or more embodiments of the present disclosure, the single-layer area may include two areas, each of which includes different conductive layers from each other. Thus, a difference in a mutual capacitance value between adjacent sensing lines, which may be caused by a difference in an etching error between the two conductive layers, may be reduced. Accordingly, the sensing reliability of the display device may be improved.

BRIEF DESCRIPTION OF THE DRAWINGS

The above and other aspects and features of the present disclosure will be more clearly understood from the following detailed description of the illustrative, non-limiting embodiments with reference to the accompanying drawings, in which:

FIG. 6A is a plan view showing portions of sensing lines of an input sensor according to an embodiment of the present disclosure;

DETAILED DESCRIPTION

Figure 1A:
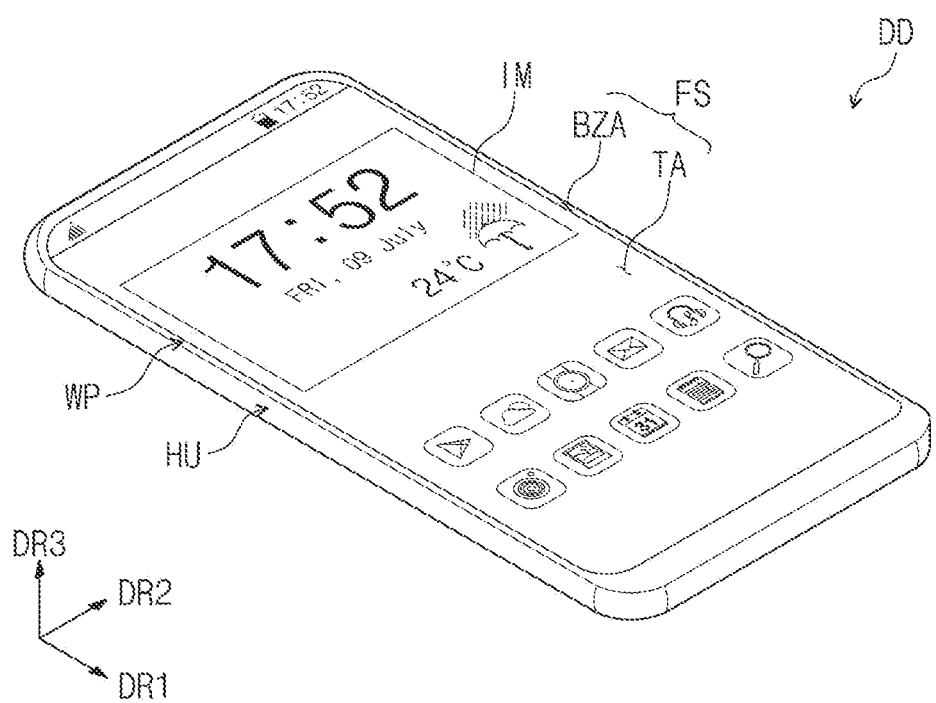
FIG. 1A is a perspective view showing a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "connected to (e.g., coupled to or attached to)" another element or layer, it can be directly on, connected to, or connected to (e.g., coupled to or attached to) the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
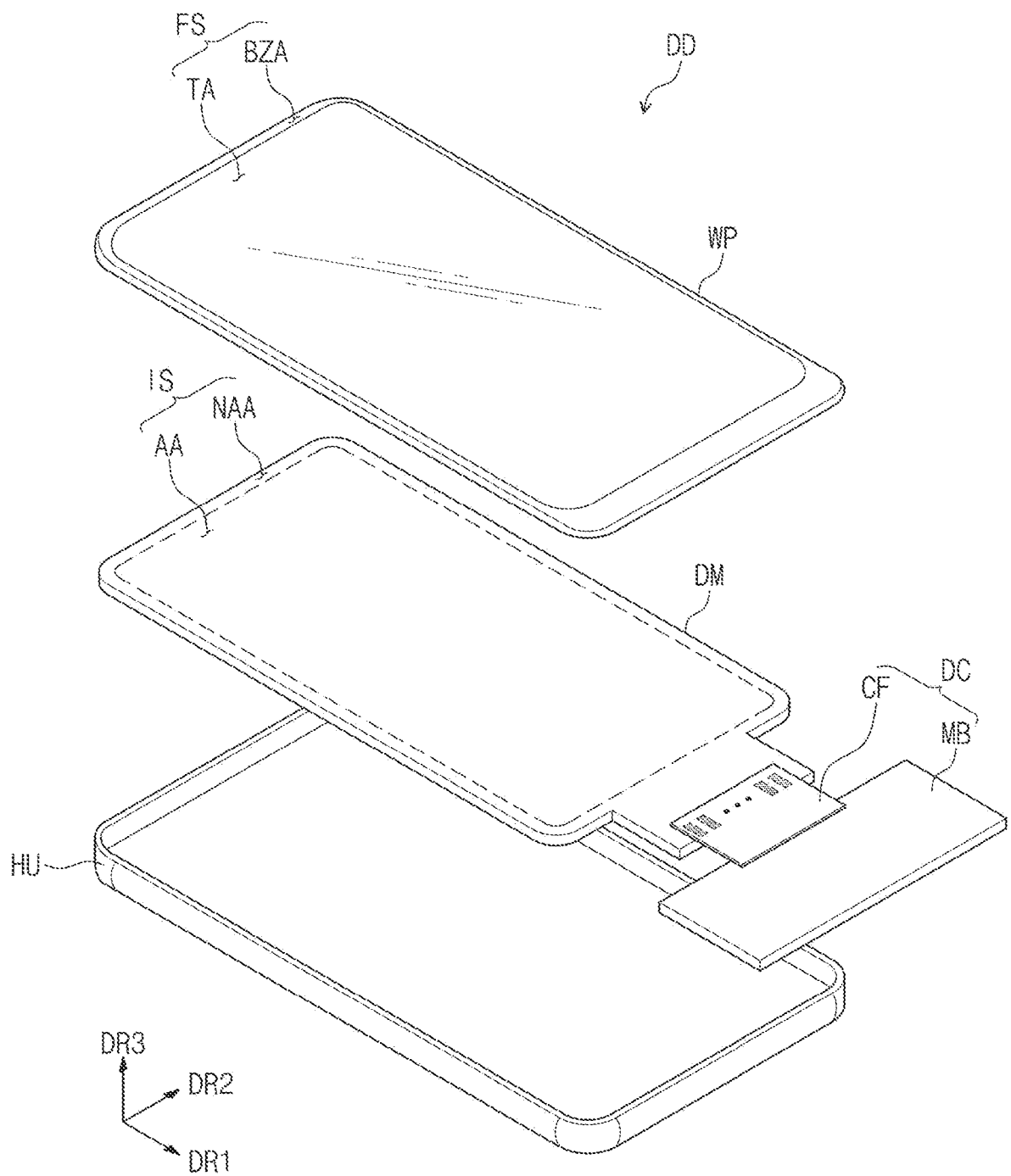
FIG. 1B is an exploded perspective view showing a display device according to an embodiment of the present disclosure.
Figure 2:
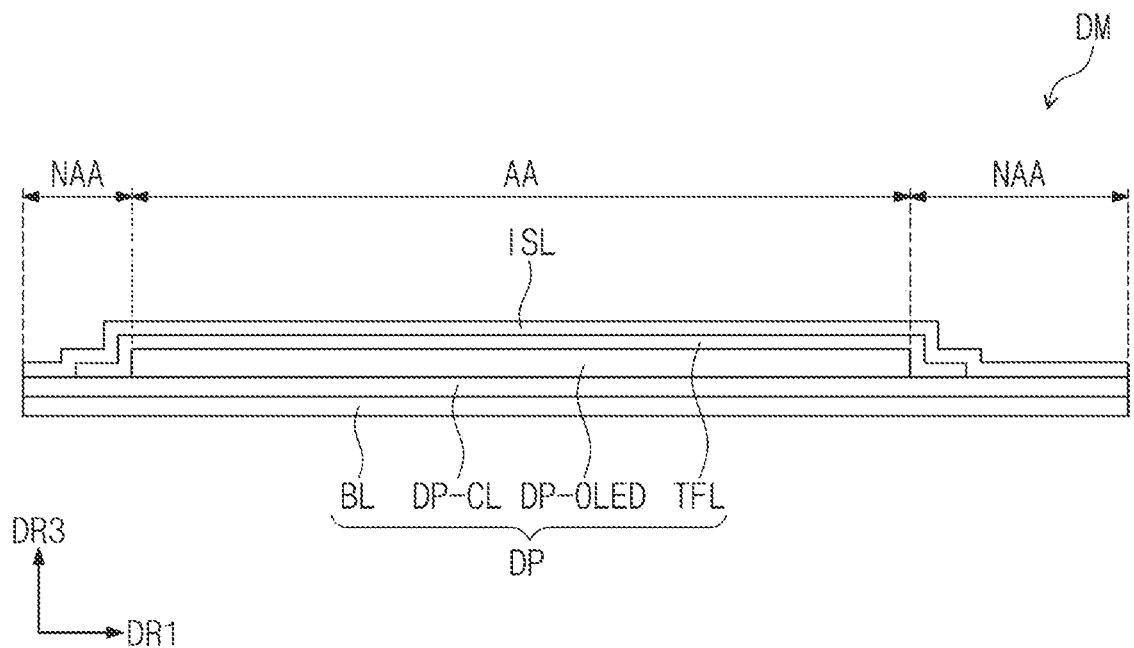
FIG. 2 is a cross-sectional view showing a display module according to an embodiment of the present disclosure.

FIG. 1A is a perspective view showing a display device DD according to an embodiment of the present disclosure. FIG. 1B is an exploded perspective view showing the display device DD according to an embodiment of the present disclosure. FIG. 2 is a cross-sectional view showing a display module (e.g., a display or a display layer) DM according to an embodiment of the present disclosure.

Referring to FIG. 1A, the display device DD may be a device that is activated in response to an electrical signal. The display device DD may include various suitable embodiments. For example, the display device DD may be applied to an electronic device, such as a smart watch, a tablet computer, a notebook computer, a computer, a smart television set, and/or the like. Hereinafter, a smartphone will be described in more detail as a representative example of the display device DD, but the present disclosure is not limited thereto.

The display device DD may display an image IM through a display surface FS toward a third direction DR3. The display surface FS may be parallel to or substantially parallel to each of a first direction DR1 and a second direction DR2. The image IM may include a video and/or a still image. FIG. 1A shows a clock widget and various application icons as a representative example of the image IM, but the present disclosure is not limited thereto. The display surface FS through which the image IM is displayed may correspond to a front surface of the display device DD, and a front surface of a window panel WP.

In the present embodiment, a front (or an upper) surface and a rear (or a lower) surface of each member of the display device DD may be defined with respect to a direction in which the image IM is displayed. For example, the front and rear surfaces may be opposite to each other in the third direction DR3, and a normal line direction of each of the front and rear surfaces may be parallel to or substantially parallel to the third direction DR3. However, the directions indicated by the first, second, and third directions DR1, DR2, and DR3 may be relative to each other, and thus, the directions indicated by the first, second, and third directions DR1, DR2, and DR3 may be variously modified to other suitable directions. As used herein, the expression "when viewed in a plane" may mean a state of being viewed in the third direction DR3, or in other words, "when viewed in a plan view."

Referring to FIG. 1B, the display device DD may include the window panel WP, the display module DM, a driving circuit DC, and a housing HU. The window panel WP and the housing HU may be connected to (e.g., coupled to or attached to) each other to provide an exterior of the display device DD.

The window panel WP may include an optically transparent insulating material. For example, the window panel WP may include a glass or plastic material. The window panel WP may have a single-layer or multi-layered structure. As an example, the window panel WP may include a plurality of plastic films that are connected to (e.g., coupled to or attached to) each other by an adhesive, or a glass substrate and a plastic film connected to (e.g., coupled to or attached to) the glass substrate by an adhesive.

The front surface of the window panel WP may define the display surface FS of the display device DD as described above. The display surface FS may include a transmissive area TA and a bezel area BZA. The transmissive area TA may be an optically transparent area. For example, the transmissive area TA may be an area having a visible light transmittance of about 90% or more.

The bezel area BZA may be an area having a relatively lower transmittance than that of the transmissive area TA. The bezel area BZA may define a shape of the transmissive area TA. The bezel area BZA may be disposed adjacent to the transmissive area TA, and may surround (e.g., around a periphery of) the transmissive area TA.

The bezel area BZA may have a suitable color (e.g., a predetermined color). The bezel area BZA may cover a peripheral area NAA of the display module DM to prevent or substantially prevent the peripheral area NAA from being viewed from the outside. However, the present disclosure is not limited thereto, and the bezel area BZA may be omitted from the window panel WP as needed or desired according to an embodiment of the present disclosure.

The display module DM may display the image IM, and may sense an external input. The display module DM may include a front surface IS in which an active area AA and the peripheral area NAA are defined. The active area AA may be an area that is activated in response to an electrical signal.

In the present embodiment, the active area AA may be an area through which the image IM is displayed, and the external input is sensed. The transmissive area TA may overlap with at least a portion of the active area AA. For example, the transmissive area TA may overlap with an entire surface of the active area AA, or at least a portion of the active area AA.

Accordingly, the user may view the image IM, and/or may provide the external input through the transmissive area TA. However, this is provided as one example, and the present disclosure is not limited thereto. According to an embodiment, the active area AA of the display module DM may be divided into an area through which the image IM is displayed, and an area in which the external input is sensed, but the present disclosure is not limited thereto or thereby.

The peripheral area NAA may be covered by the bezel area BZA. The peripheral area NAA may be disposed to be adjacent to the active area AA. The peripheral area NAA may surround (e.g., around a periphery of) the active area AA. A driving circuit or a driving line to drive the active area AA may be disposed at (e.g., in or on) the peripheral area NAA.

The driving circuit DC may include a flexible circuit board CF and a main circuit board MB. The flexible circuit board CF may be electrically connected to the display module DM. The flexible circuit board CF may connect the display module DM and the main circuit board MB to each other, but the present disclosure is not limited thereto. According to an embodiment, the flexible circuit board CF may not be connected to the main circuit board MB, and the flexible circuit board CF may be a rigid substrate.

The flexible circuit board CF may be connected to pads of the display module DM, which are disposed at (e.g., in or on) the peripheral area NAA. The flexible circuit board CF may provide electrical signals to the display module DM to drive the display module DM. The electrical signals may be generated by the flexible circuit board CF or the main circuit board MB.

The main circuit board MB may include various suitable driving circuits to drive the display module DM, and/or a connector to supply power. The main circuit board MB may be connected to the display module DM via the flexible circuit board CF.

The housing HU may be connected to (e.g., coupled to or attached to) the window panel WP. The housing HU and the window panel WP connected to (e.g., coupled to or attached to) the housing HU may provide a suitable inner space (e.g., a predetermined inner space). The display module DM may be accommodated in the inner space.

The housing HU may include a material with a relatively high rigidity. For example, the housing HU may include a glass, plastic, or metal material, or a plurality of frames and/or plates of combinations thereof. The housing HU may stably protect the components of the display device DD accommodated in the inner space from external impacts.

Referring to FIG. 2, the display module DM may include a display panel DP and an input sensor ISL. The display panel DP may include various suitable elements and configurations to generate the image IM. The image IM (e.g., refer to FIGS. 1A and 1B) generated by the display panel DP may be viewed from the outside by the user through the transmissive area TA.

The display panel 100 may be a light emitting kind of display panel, but the present disclosure is not limited thereto. For example, the display panel 100 may be an organic light emitting display panel, or an inorganic light emitting display panel. A light emitting layer of the organic light emitting display panel may include an organic light emitting material. A light emitting layer of the inorganic light emitting display panel may include a quantum dot, a quantum rod, or a micro-LED. For convenience of illustration and description, the organic light emitting display panel will be described in more detail as an example of the display panel DP, but the present disclosure is not limited thereto.

The input sensor ISL may sense the external input applied thereto from the outside. The external input may include a variety of suitable inputs provided from the outside of the display device DD (e.g., refer to FIG. 1A). As an example, the external inputs may include a proximity input (e.g., such as hovering) applied when an object (e.g., a user's finger, a pen, and/or the like) approaches close to or adjacent to the display device DD at a suitable distance (e.g., a predetermined distance), as well as a touch input by the object (e.g., a part of the user's body (e.g., the user's finger or hand), the pen, and/or the like). In addition, the external inputs may be provided in the form of a force, a pressure, light, and/or the like, but the present disclosure is not particularly limited thereto.

The display panel DP may include a base layer BL, a circuit element layer DP-CL, a display element layer DP-OLED, and an upper encapsulation layer TFL. The circuit element layer DP-CL, the display element layer DP-OLED, and the upper encapsulation layer TFL may be disposed above the base layer BL.

The base layer BL may serve as a base layer on which the circuit element layer DP-CL, the display element layer DP-OLED, and the upper encapsulation layer TFL are stacked. The base layer BL may be flexible or rigid, and may have a single-layer or multi-layered structure, but the present disclosure is not particularly limited thereto.

The circuit element layer DP-CL may be disposed on the base layer BL. The circuit element layer DP-CL may include a plurality of insulating layers, a plurality of conductive layers, and a semiconductor layer. The conductive layers of the circuit element layer DP-CL may form signal lines, or a control circuit of a pixel PX (e.g., refer to FIG. 4).

The display element layer DP-OLED may be disposed on the circuit element layer DP-CL. The display element layer DP-OLED may include organic light emitting elements, but the present disclosure is not limited thereto. According to an embodiment, the display element layer DP-OLED may include inorganic light emitting elements, organic-inorganic light emitting elements, or a liquid crystal layer.

The upper encapsulation layer TFL may include an organic layer, and a plurality of inorganic layers encapsulating the organic layer. The upper encapsulation layer TFL may encapsulate the display element layer DP-OLED, and thus, may prevent or substantially prevent moisture and/or oxygen from entering (e.g., from penetrating) the display element layer DP-OLED.

The input sensor ISL may be disposed on the upper encapsulation layer TFL. The input sensor ISL may be formed on the upper encapsulation layer TFL through successive processes. In this case, the input sensor ISL may be disposed directly on the display panel DP. As used in the present disclosure, the expression "the input sensor ISL is disposed directly on the display panel DP" means that no intervening elements are present between the input sensor ISL and the display panel DP. In other words, an additional adhesive member may not be disposed between the input sensor ISL and the display panel DP.

In some embodiments, the display module DM may further include a protective member disposed on a lower surface of the display panel DP, and an anti-reflective member disposed on an upper surface of the input sensor ISL.

Figure 3A:
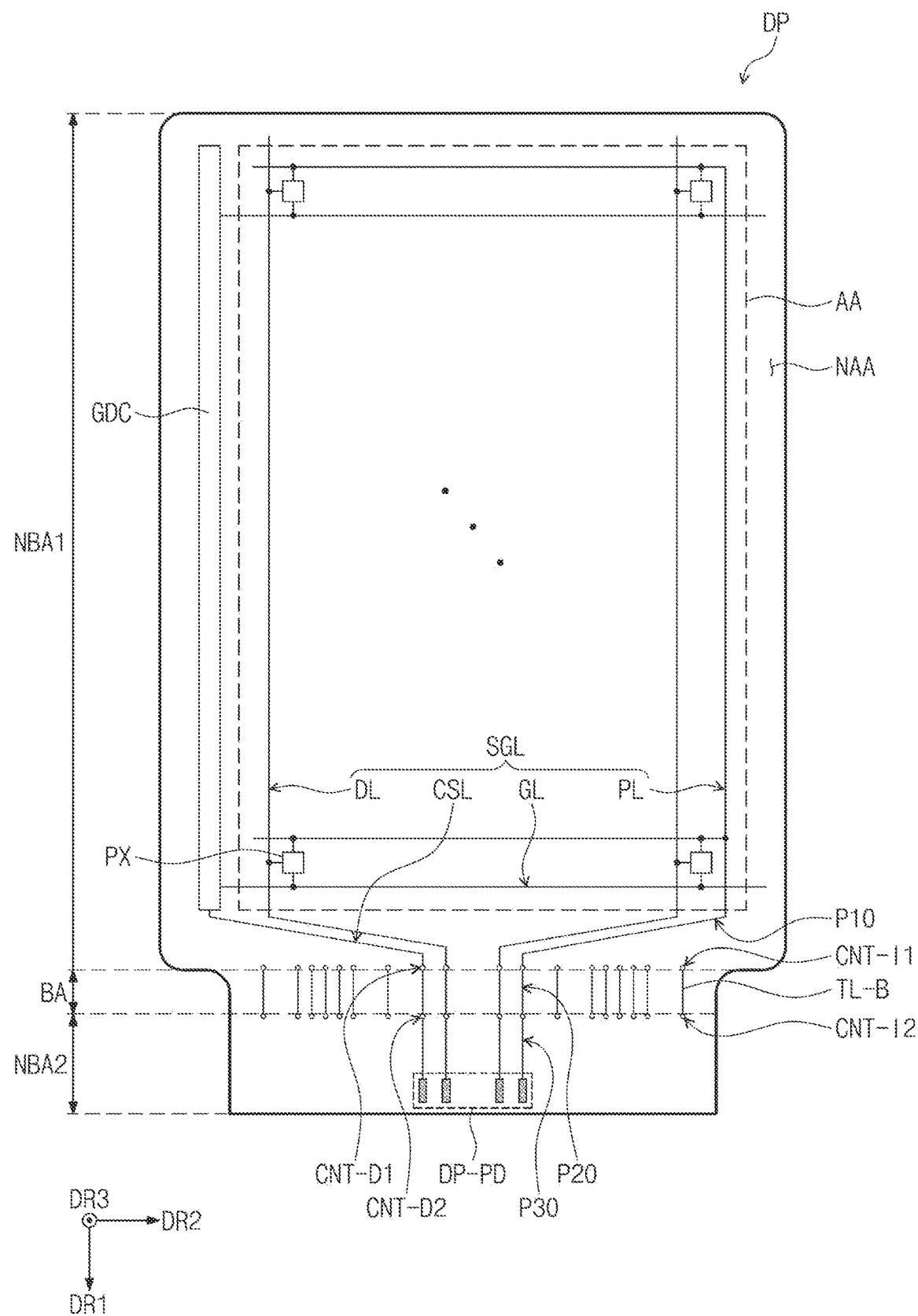
FIG. 3A is a plan view showing a display panel according to an embodiment of the present disclosure.
Figure 3B:
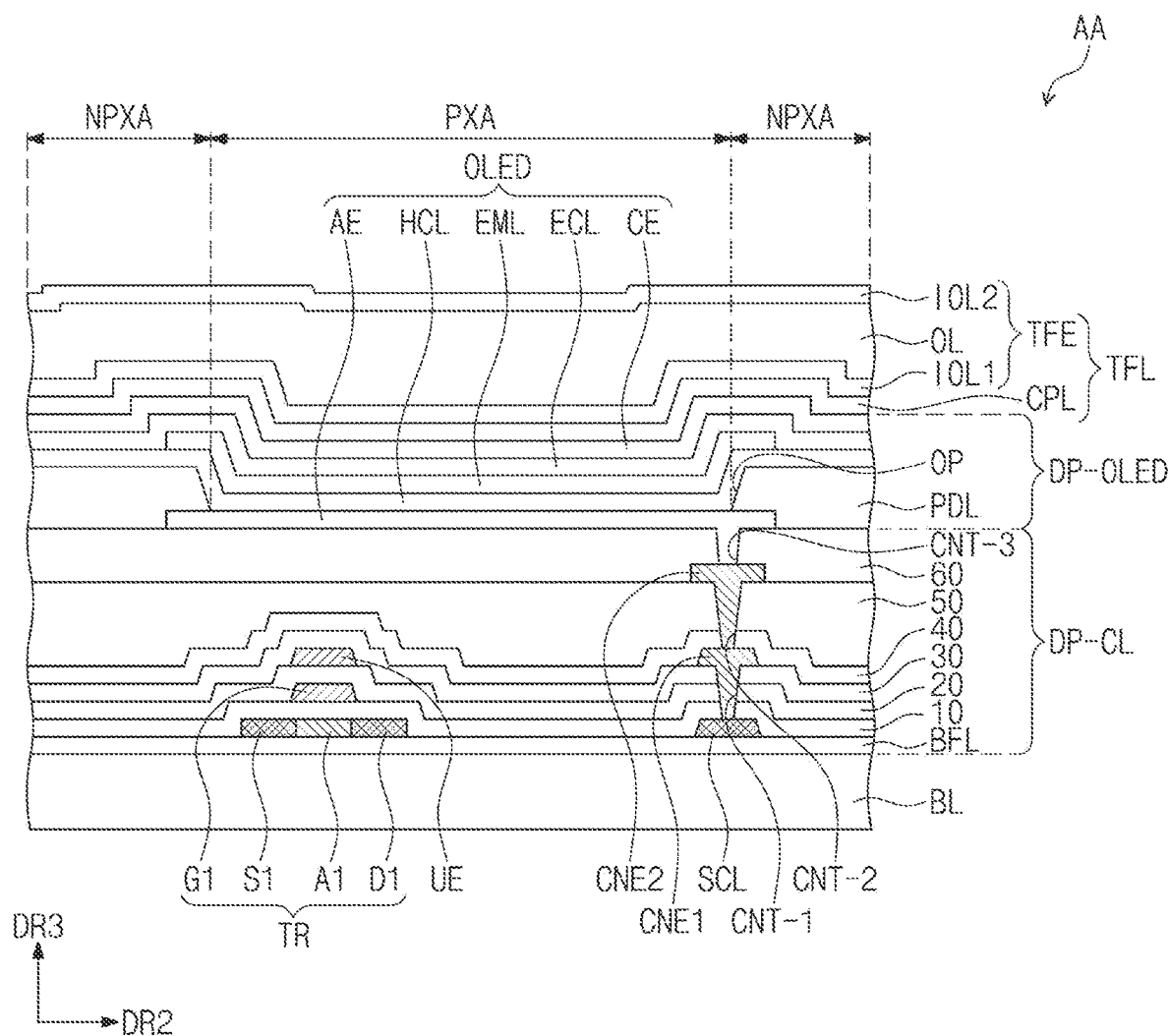
FIG. 3B is a cross-sectional view showing a display panel according to an embodiment of the present disclosure.

FIG. 3A is a plan view showing the display panel DP according to an embodiment of the present disclosure. FIG. 3B is a cross-sectional view showing the display panel DP according to an embodiment of the present disclosure.

Referring to FIG. 3A, the display panel DP may include an active area AA and a peripheral area NAA. The active area AA of the display panel DP may be the area through which the image is displayed, and the peripheral area NAA of the display panel DP may be the area at (e.g., in or on) which the driving circuit or the driving line is disposed. Light emitting elements of the pixels PX may be disposed at (e.g., in or on) the active area AA. The active area AA may overlap with at least a portion of the transmissive area TA, and the peripheral area NAA may be covered by the bezel area BZA. The active area AA and the peripheral area NAA of the display panel DP may correspond to the active area AA and the peripheral area NAA, respectively, of the display module DM shown in FIG. 1B.

According to an embodiment, the display panel DP may include a plurality of pixels PX, a plurality of signal lines SGL, a scan driving circuit GDC, a plurality of display contact holes CNT-D1 and CNT-D2, a plurality of input contact holes CNT-I1 and CNT-I2, a plurality of bridge lines TL-B, and a display pad part DP-PD including a plurality of display pads.

Each of the pixels PX may include a corresponding light emitting element, and a plurality of transistors connected to the corresponding light emitting element. The pixels PX may emit light in response to an electrical signal applied thereto.

The signal lines SGL may include scan lines GL, data lines DL, a power line PL, and a control signal line CSL. Each of the scan lines GL may be connected to corresponding pixels from among the pixels PX. Each of the data lines DL may be connected to corresponding pixels from among the pixels PX. The power line PL may be connected to the pixels PX, and may provide a power source voltage to the pixels PX. The control signal line CSL may apply control signals to the scan driving circuit GDC.

The scan driving circuit GDC may be disposed at (e.g., in or on) the peripheral area NAA. The scan driving circuit GDC may generate scan signals, and may sequentially output the scan signals to the scan lines GL. The scan driving circuit GDC may further output another control signal to the driving circuit of the pixels PX.

The scan driving circuit GDC may include a plurality of thin film transistors formed through the same or substantially the same process as that of the driving circuit of the pixels PX. For example, the thin film transistors of the scan driving circuit GDC may be formed through a low temperature polycrystalline silicon (LTPS) process, or a low temperature polycrystalline oxide (LTPO) process.

A portion of the display panel DP may be bent. The display panel DP may include a first non-bending area NBA1, a second non-bending area NBA2 spaced apart from the first non-bending area NBA1 in the first direction DR1, and a bending area BA disposed between the first non-bending area NBA1 and the second non-bending area NBA2. The first non-bending area NBA1 may include the active area AA, and a portion of the peripheral area NAA. The peripheral area NAA may include the bending area BA and the second non-bending area NBA2.

The bending area BA may be bent with respect to an imaginary axis extending in the second direction DR2. When the bending area BA is bent, the second non-bending area NBA2 may face the first non-bending area NBA1. According to an embodiment, a width in the second direction DR2 of the display panel DP may be smaller in the bending area BA than in the first non-bending area NBA1.

The display pad part DP-PD may be disposed to be adjacent to an edge of the second non-bending area NBA2. The signal lines SGL may extend to the second non-bending area NBA2 from the first non-bending area NBA1 via the bending area BA, and may be connected to the display pad part DP-PD. The display pad part DP-PD may electrically connect the display panel DP and the flexible circuit board CF to each other.

The display contact holes CNT-D1 and CNT-D2 may include first display contact holes CNT-D1 defined at (e.g., in or on) the first non-bending area NBA1 adjacent to the bending area BA, and second display contact holes CNT-D2 defined at (e.g., in or on) the second non-bending area NBA2 adjacent to the bending area BA.

According to an embodiment, the signal lines SGL may include first, second, and third portions P10, P20, and P30 that are disposed at (e.g., in or on) different layers from each other. The first and second portions P10 and P20 may be connected to each other via the first display contact holes CNT-D1, and the second and third portions P20 and P30 may be connected to each other via the second display contact holes CNT-D2.

The input contact holes CNT-I1 and CNT-I2 may include first input contact holes CNT-I1 defined at (e.g., in or on) the first non-bending area NBA1 adjacent to the bending area BA, and second input contact holes CNT-I2 defined at (e.g., in or on) the second non-bending area NBA2 adjacent to the bending area BA.

The bridge lines TL-B may be disposed at (e.g., in or on) the bending area BA. One end of each of the bridge lines TL-B may be connected to a corresponding first input contact hole CNT-I1, and the other end of each of the bridge lines TL-B may be connected to a corresponding second input contact hole CNT-I2. The first and second input contact holes CNT-I1 and CNT-I2 and the bridge lines TL-B may connect sensing lines TL-1, TL-2, and TL-3 of the input sensor ISL to an input pad part ISL-PD including a plurality of input pads (e.g., see FIG. 5).

Referring to FIG. 3B, the circuit element layer DP-CL, the display element layer DP-OLED, and the upper encapsulation layer TFL may be sequentially stacked on the base layer BL. The circuit element layer DP-CL, the display element layer DP-OLED, and the upper encapsulation layer TFL will be described in more detail below with reference to FIG. 4.

The circuit element layer DP-CL may include at least one insulating layer, and a circuit element. The circuit element may include a signal line and a pixel driving circuit. The circuit element layer DP-CL may be formed by a coating or depositing process to form an insulating layer, a semiconductor layer, and a conductive layer, and a photolithography process to pattern the insulating layer, the semiconductor layer, and the conductive layer.

The buffer layer BFL may include a plurality of inorganic layers stacked one on another. A semiconductor pattern may be disposed on the buffer layer BFL. The buffer layer BFL may increase a coupling force between the base layer BL and the semiconductor pattern.

The semiconductor pattern may include polysilicon, but the present disclosure is not limited thereto or thereby. The semiconductor pattern may include an amorphous silicon or a metal oxide. FIG. 3B shows a portion of the semiconductor pattern, and the semiconductor pattern may be further disposed at (e.g., in or on) another area of the pixel PX when viewed in a plane (e.g., in a plan view). The semiconductor pattern may be arranged according to a suitable rule (e.g., a specific rule) over the pixels PX.

The semiconductor pattern may have various different electrical properties depending on whether it is doped or not, or whether it is doped with an N-type dopant or a P-type dopant. The semiconductor pattern may include a first region A1 with a low doping concentration and low conductivity, and second regions S1 and D1 with a relatively high doping concentration and high conductivity. One second region S1 may be disposed at one side of the first region A1, and the other second region S2 may be disposed at the other side of the first region A1. The second regions S1 and D1 may be doped with the N-type dopant or the P-type dopant. A P-type transistor may include a doped region that is doped with the P-type dopant. The first region A1 may be a non-doped region, or may be a region that is doped at a concentration lower than those of the second regions S1 and D1.

The second regions S1 and D1 may serve or substantially serve as an electrode or a signal line. For example, the one second area S1 may correspond to a source of a transistor, and the other second area D1 may correspond to a drain of the transistor. FIG. 3B shows a portion of a connection signal line SCL that is formed of the semiconductor pattern. The connection signal line SCL may be connected to the drain of the transistor TR when viewed in a plane (e.g., in a plan view).

A first insulating layer 10 may be disposed on the buffer layer BFL. The first insulating layer 10 may commonly overlap with the pixels PX (e.g., refer to FIG. 3A), and may cover the semiconductor pattern. The first insulating layer 10 may be an inorganic layer and/or an organic layer, and may have a single-layer or multi-layered structure. The first insulating layer 10 may include at least one of aluminum oxide, titanium oxide, silicon oxide, silicon oxynitride, zirconium oxide, or hafnium oxide. Not only the first insulating layer 10, but also an insulating layer of the circuit element layer DP-CL described in more detail below may be an inorganic layer and/or an organic layer, and may have a single-layer or multi-layered structure.

A gate G1 may be disposed on the first insulating layer 10. The gate G1 may be a portion of a metal pattern. The gate G1 may overlap with the first area A1. The gate G1 may be used as a mask in a process of doping the semiconductor pattern.

A second insulating layer 20 may be disposed on the first insulating layer 10, and may cover the gate G1. The second insulating layer 20 may commonly overlap with the pixels PX (e.g., refer to FIG. 3A). An upper electrode UE may be disposed on the second insulating layer 20. The upper electrode UE may overlap with the gate G1. The upper electrode UE may include a plurality of metal layers. However, the present disclosure is not limited thereto, and according to an embodiment, the upper electrode UE may be omitted.

A third insulating layer 30 may be disposed on the second insulating layer 20, and may cover the upper electrode UE. A first connection electrode CNE1 may be disposed on the third insulating layer 30. The first connection electrode CNE1 may be connected to the connection signal line SCL via a contact hole CNT-1 defined (e.g., penetrating) through the first, second, and third insulating layers 10, 20, and 30.

A fourth insulating layer 40 may be disposed on the third insulating layer 30. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 via a contact hole CNT-2 defined (e.g., penetrating) through the fourth insulating layer 40 and the fifth insulating layer 50. A sixth insulating layer 60 may be disposed on the fifth insulating layer 50, and may cover the second connection electrode CNE2. The sixth insulating layer 60 may be an organic layer.

According to an embodiment, the first portion P10 and the third portion P30 of the signal lines SGL described above with reference to FIG. 3A may be disposed at (e.g., in or on) the same layer as that of the gate G1, and the second portion P20 may be disposed at (e.g., in or on) the same layer as that of the second connection electrode CNE2. The bridge lines TL-B described above with reference to FIG. 3A may be disposed at (e.g., in or on) the same layer as that of the second connection electrode CNE2.

In addition, the display contact holes CNT-D1 and CNT-D2 and the input contact holes CNT-I1 and CNT-I2, which are described above with reference to FIG. 3A, may each be defined (e.g., may each penetrate) through at least one insulating layer disposed between corresponding two portions from among the first, second, and third portions P10, P20, and P30 to connect the corresponding two portions to each other. Accordingly, the display contact holes CNT-D1 and CNT-D2 (e.g., refer to FIG. 3A) may be formed in the same manner as that of any one of the contact holes CNT-1 and CNT-2 shown in FIG. 3B.

An organic light emitting diode OLED may be disposed on the sixth insulating layer 60. In some embodiments, the organic light emitting diode OLED may include a first electrode AE, a hole control layer HCL, a light emitting layer EML, an electron control layer ECL, and a second electrode CE. The first electrode AE may be disposed on the sixth insulating layer 60. The first electrode AE may be connected to the second connection electrode CNE2 via a contact hole CNT-3 defined (e.g., penetrating) through the sixth insulating layer 60. A pixel definition layer PDL may be disposed on the sixth insulating layer 60, and may be provided with an opening OP defined therethrough. At least a portion of the first electrode AE may be exposed through the opening OP of the pixel definition layer PDL. The pixel definition layer PDL may be an organic layer.

As shown in FIG. 3B, the active area AA may include a light emitting area PXA, and a non-light-emitting area NPXA adjacent to the light emitting area PXA. The non-light-emitting area NPXA may surround (e.g., around a periphery of) the light emitting area PXA. In the present embodiment, the light emitting area PXA may be defined to correspond to the portion of the first electrode AE that is exposed through the opening OP.

The hole control layer HCL may be commonly disposed at (e.g., in or on) the light emitting area PXA and the non-light-emitting area NPXA. The hole control layer HCL may include a hole transport layer, and may further include a hole injection layer. The light emitting layer EML may be disposed on the hole control layer HCL. The light emitting layer EML may be disposed at (e.g., in or on) an area corresponding to the opening OP. In other words, the light emitting layer EML may be disposed separately for each of the pixels PX (e.g., refer to FIG. 3A) after being divided into a plurality of portions.

The electron control layer ECL may be disposed on the light emitting layer EML. The electron control layer ECL may include an electron transport layer, and may further include an electron injection layer. The hole control layer HCL and the electron control layer ECL may be commonly disposed over the pixels using an open mask.

The second electrode CE may be disposed on the electron control layer ECL. The second electrode CE may have an integral shape, and may be commonly disposed over the pixels PX (e.g., refer to FIG. 3A).

The upper encapsulation layer TFL may be disposed on the display element layer DP-OLED, and may include a plurality of thin layers. According to an embodiment, the upper encapsulation layer TFL may include a capping layer CPL, and a thin film encapsulation layer TFE disposed on the capping layer CPL. The capping layer CPL may be disposed on the second electrode CE, and may be in contact with the second electrode CE. The capping layer CPL may include an organic material.

The thin film encapsulation layer TFE may include a first inorganic layer IOL1, an organic layer OL disposed on the first inorganic layer IOL1, and a second inorganic layer IOL2 disposed on the organic layer OL. The first inorganic layer IOL1 and the second inorganic layer IOL2 may protect the display element layer DP-OLED from moisture and oxygen, and the organic layer OL may protect the display element layer DP-OLED from a foreign substance, for example, such as dust particles.

Figure 4:
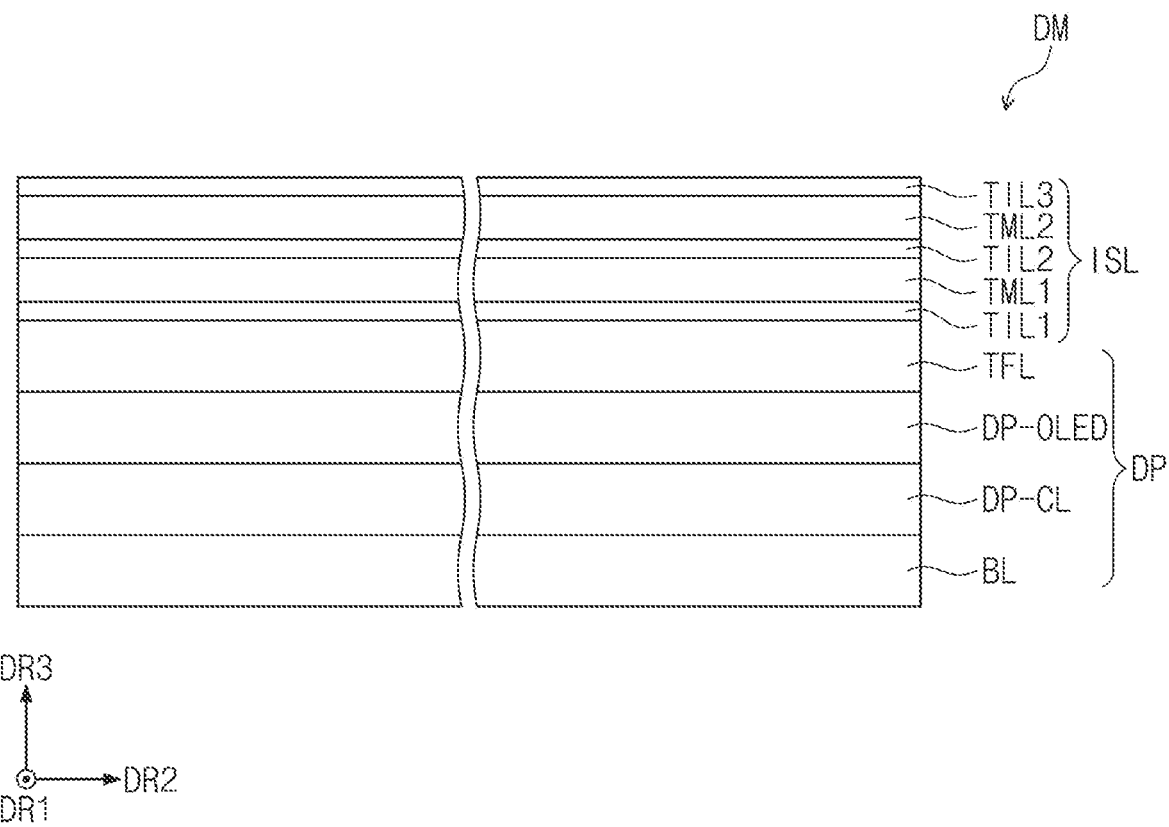
FIG. 4 is a cross-sectional view showing a display module according to an embodiment of the present disclosure.
Figure 5:
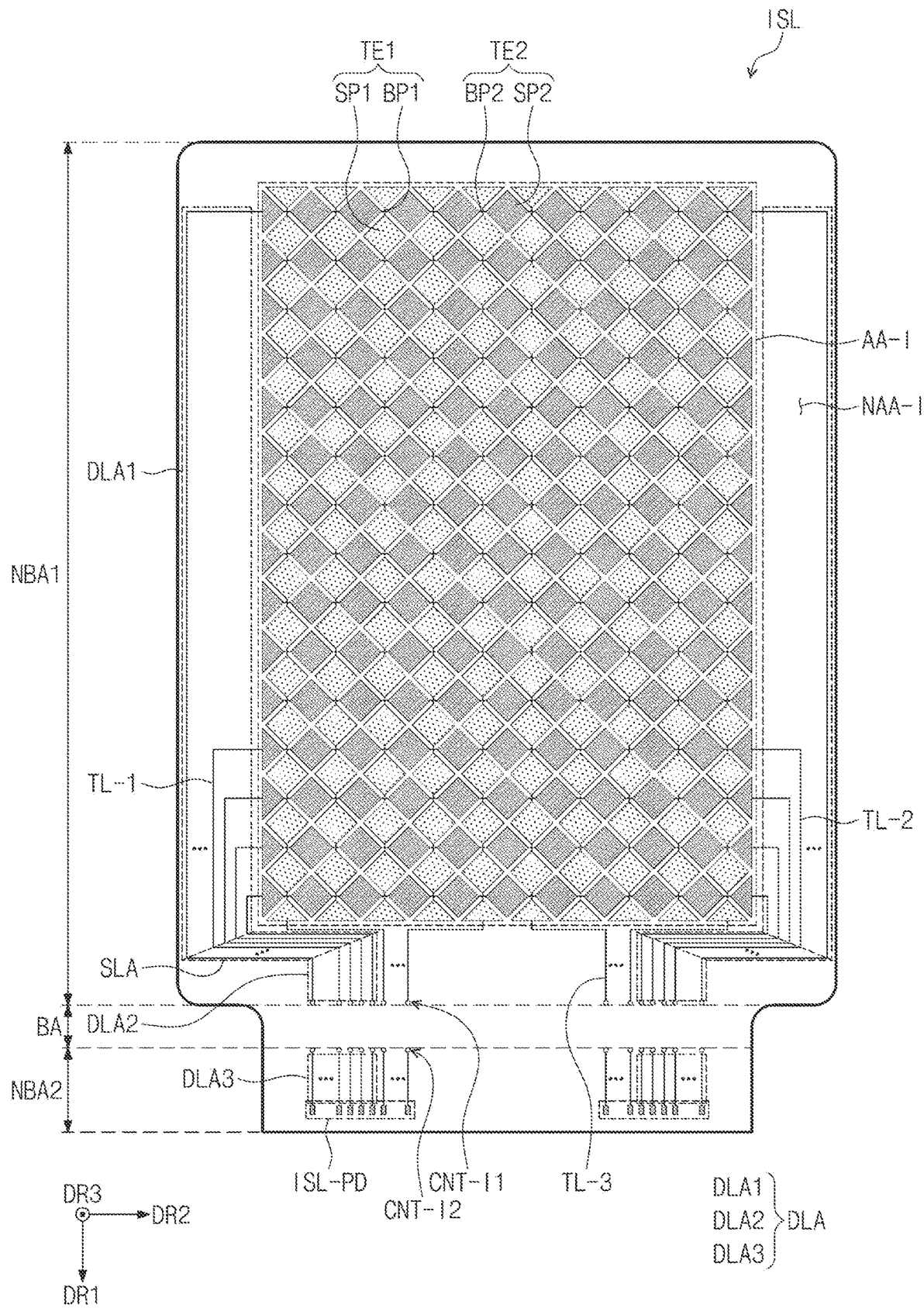
FIG. 5 is a plan view showing an input sensor according to an embodiment of the present disclosure.

FIG. 4 is a cross-sectional view showing the display module DM according to an embodiment of the present disclosure. FIG. 5 is a plan view showing the input sensor ISL according to an embodiment of the present disclosure.

Referring to FIG. 4, the input sensor ISL may be disposed on the upper encapsulation layer TFL. The input sensor ISL may include a first sensing insulating layer TIL1, a first sensing conductive layer TML1, a second sensing insulating layer TIL2, a second sensing conductive layer TML2, and a third sensing insulating layer TIL3.

The first sensing insulating layer TIL1 may be disposed directly on the upper encapsulation layer TFL. However, the present disclosure is not limited thereto, and according to an embodiment, the first sensing insulating layer TIL1 may be omitted as needed or desired.

Each of the first sensing conductive layer TML1 and the second sensing conductive layer TML2 may have a single-layer structure or a multi-layered structure. The conductive layer having the multi-layered structure may include two or more layers of a transparent conductive layer and a metal layer. The conductive layer having the multi-layered structure may include metal layers containing different metals from each other.

The first and second sensing conductive layers TML1 and TML2 may include at least one of indium tin oxide (ITO), indium zinc oxide (IZO), zinc oxide (ZnO), indium tin zinc oxide (ITZO), PEDOT, a metal nanowire, or graphene as the transparent conductive layer. The first and second sensing conductive layers TML1 and TML2 may include molybdenum, silver, titanium, copper, aluminum, and/or alloys thereof as the metal layer.

Each of the first and second sensing conductive layers TML1 and TML2 may have a three-layered structure of titanium/aluminum/titanium. Metals with a relatively high durability and a low reflectance may be applied as an outer layer of the conductive layer, and metals with a high electrical conductivity may be applied as an inner layer of the conductive layer.

Each of the first, second, and third sensing insulating layers TIL1, TIL2, and TIL3 may include an inorganic layer or an organic layer. According to an embodiment, each of the first and second sensing insulating layers TIL1 and TIL2 may include the inorganic layer, and the third sensing insulating layer TIL3 may include the organic layer. The inorganic layer may include at least one of aluminum oxide, titanium oxide, silicon oxide, silicon oxynitride, zirconium oxide, or hafnium oxide. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyimide-based resin, or a perylene-based resin.

Referring to FIG. 5, the input sensor ISL may include an active area AA-I, and a peripheral area NAA-I adjacent to the active area AA-I. The active area AA-I and the peripheral area NAA-I of the input sensor ISL may correspond to the active area AA and the peripheral area NAA (e.g., refer to FIG. 3A), respectively, of the display panel DP.

According to an embodiment, the input sensor ISL may include a first non-bending area NBA1, a bending area BA, and a second non-bending area NBA2. The first non-bending area NBA1, the bending area BA, and the second non-bending area NBA2 of the input sensor ISL may correspond to the first non-bending area NBA1, the bending area BA, and the second non-bending area NBA2 (e.g., refer to FIG. 3A), respectively, of the display panel DP.

According to an embodiment, the input sensor ISL may include a plurality of sensing electrodes TE1 and TE2, a plurality of sensing lines TL-1, TL-2, and TL-3 connected to the sensing electrodes TE1 and TE2, a plurality of input contact holes CNT-I1 and CNT-I2, and an input pad part ISL-PD.

The sensing electrodes TE1 and TE2 may include a first sensing electrode TE1 and a second sensing electrode TE2.

The first sensing electrode TE1 may extend in the first direction DR1. and may be provided in a plurality of first sensing electrodes TE1 arranged along the second direction DR2. The first sensing electrode TE1 may include first sensing patterns SP1 and first conductive patterns BP1. The first sensing patterns SP1 may be arranged along the first direction DR1. At least one first conductive pattern BP1 may be connected to two first sensing patterns SP1 that are adjacent to each other.

The second sensing electrode TE2 may extend in the second direction DR2, and may be provided in a plurality of second sensing electrodes TE2 arranged along the first direction DR1. The second sensing electrode TE2 may include second sensing patterns SP2 and second conductive patterns BP2. The second sensing patterns SP2 may be arranged along the second direction DR2. At least one second conductive pattern BP2 may be disposed between two second sensing patterns SP2 that are adjacent to each other. According to an embodiment, the second sensing patterns SP2 and the second conductive patterns BP2 may be patterned through the same process, and may be provided integrally with each other.

According to an embodiment, the first conductive pattern BP1 may be included in the first sensing conductive layer TML1 described above with reference to FIG. 4, and the first sensing patterns SP1, the second sensing patterns SP2, and the second conductive pattern BP2 may be included in the second sensing conductive layer TML2 described above with reference to FIG. 4.

The sensing lines TL-1, TL-2, and TL-3 may include first sensing lines TL-1, second sensing lines TL-2, and third sensing lines TL-3.

According to an embodiment, the first sensing lines TL-1 may be connected to one ends (e.g., first ends) of the second sensing electrodes TE2, respectively. The second sensing lines TL-2 may be connected to the other ends (e.g., second ends or opposite ends) of the second sensing electrodes TE2, respectively. The third sensing lines TL-3 may be respectively connected to one ends of the first sensing electrodes TE1 that are adjacent to the bending area BA.

However, the present disclosure is not limited thereto or thereby. According to an embodiment, instead of the first and second sensing lines TL-1 and TL-2 that are connected to opposite ends of the second sensing electrodes TE2, the sensing lines may be connected to only one of the opposite ends of each of the second sensing electrodes TE2, and in this case, one of the first and second input contact holes CNT-I1 and CNT-I2 may be omitted.

Each of the first, second, and third sensing lines TL-1, TL-2, and TL-3 may be disposed to overlap with the first non-bending area NBA1 and the second non-bending area NBA2, but may not overlap with the bending area BA. From among the first, second, and third sensing lines TL-1, TL-2, and TL-3, portions that are disposed to overlap with the first non-bending area NBA1 may be connected to the bridge lines TL-B described above with reference to FIG. 3A via the first input contact holes CNT-I1, and portions that are disposed to overlap with the second non-bending area NBA2 may be connected to the bridge lines TL-B via the second input contact holes CNT-I2. The input contact holes CNT-I1 and CNT-I2 may be defined (e.g., may penetrate) through the first sensing insulating layer TIL1 and one or more of the insulating layers of the display panel DP described above with reference to FIG. 3B.

According to an embodiment, the first sensing electrodes TE1 may be a transmission electrode, and the second sensing electrodes TE2 may be a reception electrode. Accordingly, the third sensing lines TL-3 may apply a sensing signal to the first sensing electrodes TE1, and each of the first and second sensing lines TL-1 and TL-2 may receive the sensing signal from the second sensing electrodes TE2, but the present disclosure is not limited thereto or thereby. According to an embodiment, the first sensing electrodes TE1 may be the reception electrode, and the second sensing electrodes TE2 may be the transmission electrode.

The input pad part ISL-PD may be disposed to be adjacent to an edge of the second non-bending area NBA2. The first, second, and third sensing lines TL-1, TL-2, and TL-3 may extend from the second input contact holes CNT-I2, and may be connected to the input pad part ISL-PD. The input pad part ISL-PD may electrically connect the input sensor ISL and the flexible circuit board CF to each other.

However, the present disclosure is not limited thereto or thereby. According to an embodiment, the input pad part ISL-PD may be omitted from the input sensor ISL. In this case, the first, second, and third sensing lines TL-1, TL-2, and TL-3 may be connected to lines and pads arranged at (e.g., in or on) the display panel DP via contact holes defined through the first and second sensing insulating layers TIL1 and TIL2. Accordingly, the sensing electrodes TE1 and TE2 and the pixel PX (e.g., refer to FIG. 3A) may be connected to the main circuit board MB via one flexible circuit board CF.

According to one or more embodiments of the present disclosure, each of the first sensing lines TL-1 and the second sensing lines TL-2 may include one or more multi-layered areas DLA1, DLA2, and DLA3, and a single-layer area SLA. Each of the first and second sensing lines TL-1 and TL-2 may include a plurality of trace lines that are disposed at (e.g., in or on) different layers in the multi-layered areas DLA1, DLA2, and DLA3, and may include one trace line in the single-layer area SLA. This will be described in more detail below.

According to an embodiment, as shown in FIG. 5, the multi-layered areas DLA1, DLA2, and DLA3 may include a first multi-layered area DLA1, a second multi-layered area DLA2, and a third multi-layered area DLA3, which are included at (e.g., in or on) different areas from each other of the display panel DP. As an example, the first multi-layered area DLA1 and the second multi-layered area DLA2 may overlap with the first non-bending area NBA1 of the display panel DP. The third multi-layered area DLA3 may overlap with the second non-bending area NBA2.

In the first multi-layered area DLA1, each of the first and second sensing lines TL-1 and TL-2 connected to the second sensing electrodes TE2 may extend in a direction toward the bending area BA. In the second multi-layered area DLA2, each of the first and second sensing lines TL-1 and TL-2 may be connected to one end of the bridge line TL-B shown in FIG. 3A via a corresponding one of the first input contact holes CNT-I1.

In the third multi-layered area DLA3, one end of each of the first and second sensing lines TL-1 and TL-2 may be connected to the other end of the bridge line TL-B shown in FIG. 3 via a corresponding one of the second input contact holes CNT-I2. In the third multi-layered area DLA3, the other end of each of the first and second sensing lines TL-1 and TL-2 may be connected to the input pad part ISL-PD (e.g., may be connected to a corresponding input pad of the input pad part ISL-PD).

According to an embodiment, the single-layer area SLA may be defined to overlap with the first non-bending area NBA1 of the display panel DP. The single-layer area SLA may be disposed between the first multi-layered area DLA1 and the second multi-layered area DLA2. The single-layer area SLA may be disposed near (e.g., adjacent to) one end of the first non-bending area NBA1 that is adjacent to the bending area BA.

In the first non-bending area NBA1, the first and second sensing lines TL-1 and TL-2 are intensively placed (e.g., arranged or located) at (e.g., in or on) a portion of the peripheral area NAA-I where a width in the second direction DR2 decreases at a lower portion of the active area AA-I (e.g., at left/right lower ends of the input sensor ISL), and thus, a space to arrange the first and second sensing lines TL-1 and TL-2 may be insufficient.

According to the present embodiment, as shown in FIG. 5, a width (e.g., in the first direction DR1) of the single-layer area SLA may be smaller than a width (e.g., in the second direction DR2) of the multi-layered areas DLA1, DLA2, and DLA3 in a direction crossing the direction in which the first and second sensing lines TL-1 and TL-2 extend at the single-layer area SLA and the multi-layered areas DLA1, DLA2, and DLA3. When the width of the first and second sensing lines TL-1 and TL-2 decreases, the space in which the sensing lines are arranged may be secured, and a width of the bezel area BZA of the display panel DP (e.g., refer to FIG. 1A) may be decreased. This will be described in more detail below.

According to an embodiment, as shown in FIG. 5, each of the first sensing lines TL-1 and the second sensing lines TL-2 may extend in the first direction DR1 at (e.g., in or on) the multi-layered areas DLA1, DLA2, and DLA3, and may extend in the second direction DR2 at (e.g., in or on) the single-layer area SLA, but the present disclosure is not limited thereto or thereby. According to an embodiment, each of the first sensing lines TL-1 and the second sensing lines TL-2 may extend in an oblique direction at (e.g., in or on) the single-layer area SLA, and may extend to fit a shape of the portions where the space for the arrangement of the first sensing lines TL-1 and the second sensing lines TL-2 is insufficient.

FIG. 5 shows a structure in which the first and second multi-layered areas DLA1 and DLA2 are included in the area overlapping with the first non-bending area NBA1 of the display panel DP as a representative example, but the present disclosure is not limited thereto or thereby. According to an embodiment, the second multi-layered area DLA2 may be omitted from the area overlapping with the first non-bending area NBA1, and thus, the sensing lines may include one multi-layered area in the area overlapping with the first non-bending area NBA1.

In addition, FIG. 5 shows a structure in which the first, second, and third sensing lines TL-1, TL-2, and TL-3 are connected to separate lines disposed on the insulating layer of the display panel DP at (e.g., in or on) the bending area BA as a representative example, but the present disclosure is not limited thereto or thereby. The first, second, and third sensing lines TL-1, TL-2, and TL-3 may be disposed at (e.g., in or on) the insulating layer of the display panel DP in the area overlapping with the second non-bending area NBA2.

Figure 6B:
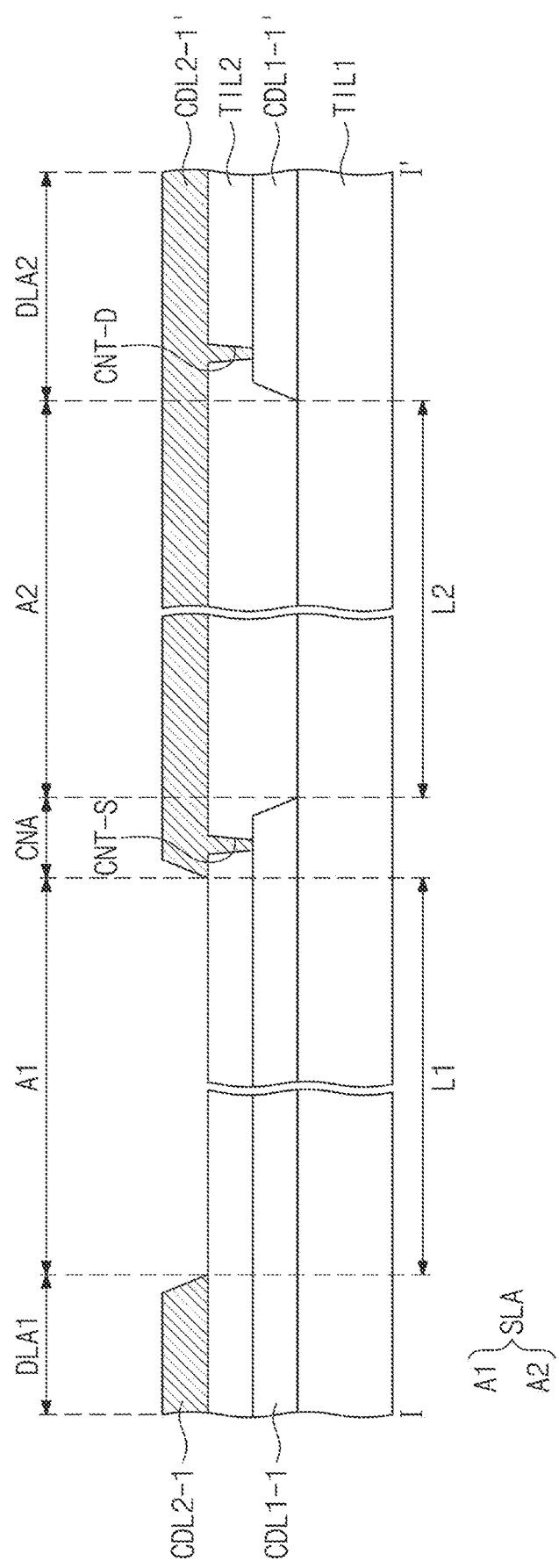
FIG. 6B is a cross-sectional view taken along the line I-I' of FIG. 6A.
Figure 6C:
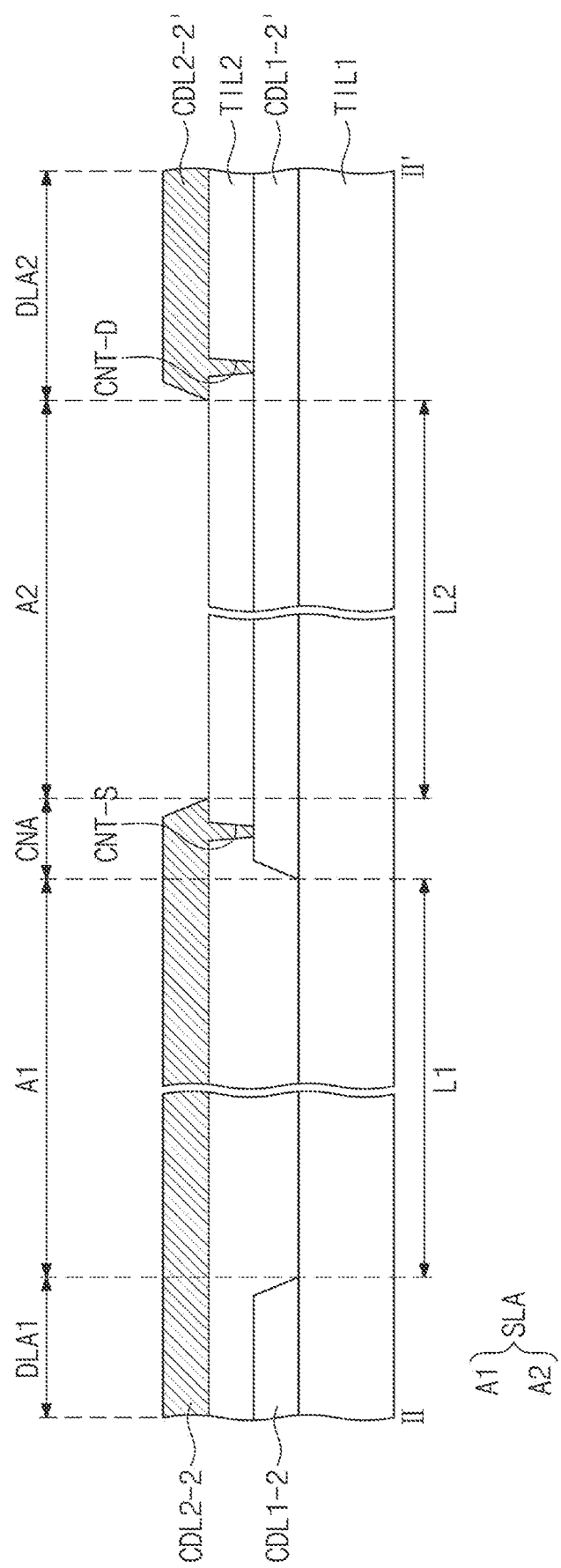
FIG. 6C is a cross-sectional view taken along the line II-II' of FIG. 6A.
Figure 7A:
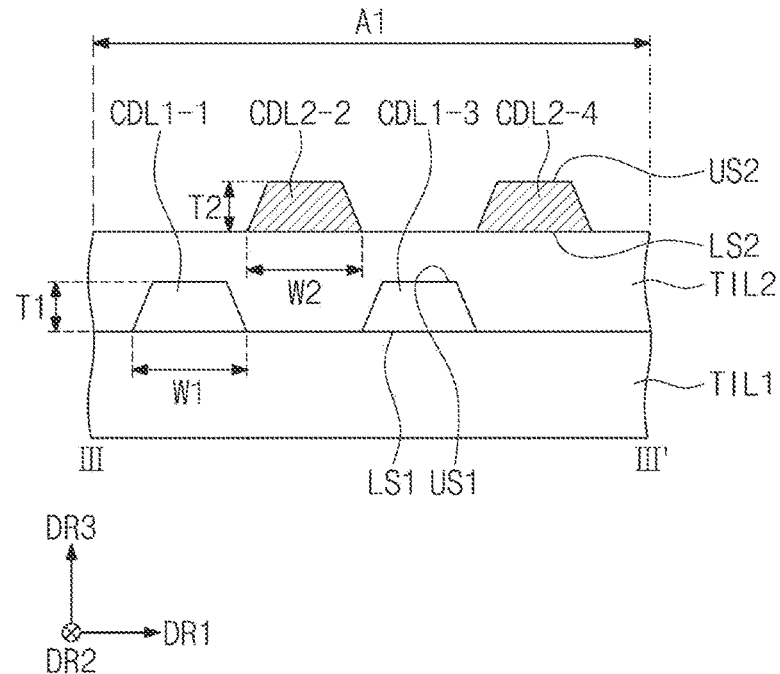
FIG. 7A is a cross-sectional view taken along the line III-III' of FIG. 6A.
Figure 7B:
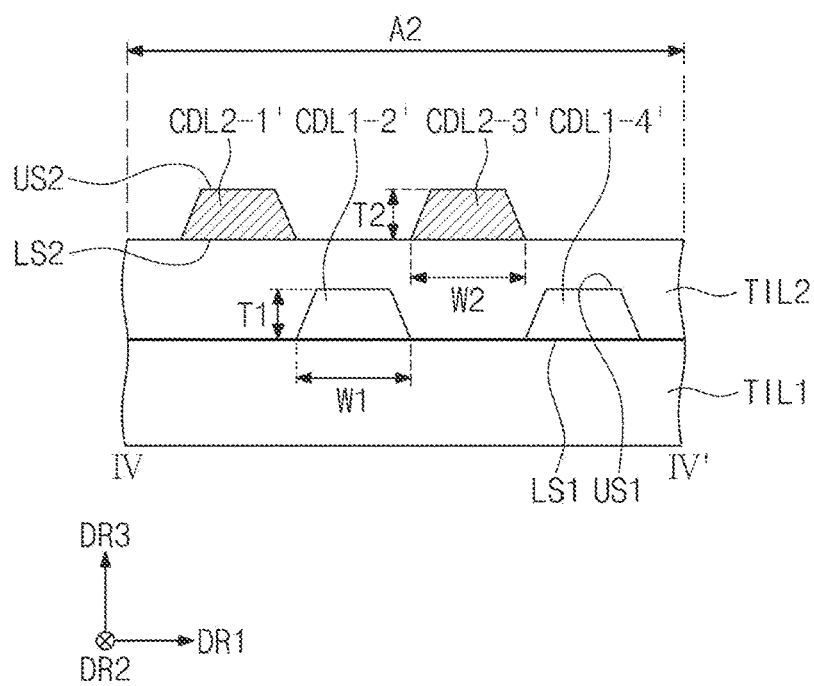
FIG. 7B is a cross-sectional view taken along the line IV-IV' of FIG. 6A.

FIG. 6A is a plan view showing portions of the sensing lines of the input sensor according to an embodiment of the present disclosure. FIG. 6B is a cross-sectional view taken along the line I-I' of FIG. 6A. FIG. 6C is a cross-sectional view taken along the line II-II' of FIG. 6A. FIG. 7A is a cross-sectional view taken along the line III-III' of FIG. 6A. FIG. 7B is a cross-sectional view taken along the line IV-IV' of FIG. 6A. FIGS. 6B and 6C show cross-sections viewed in a direction in which the first sensing lines TL-1 are arranged, and FIGS. 7A and 7B show cross-sections viewed in a direction in which the first sensing lines TL-1 extend.

FIG. 6A is an enlarged plan view showing portions of four first sensing lines that are connected to corresponding second sensing electrodes TE2 from among the first sensing lines TL-1 shown in FIG. 5.

FIG. 6A shows portions of first, second, third, and fourth lines TL1, TL2, TL3, and TL4 that are disposed to overlap with the first non-bending area NBA1 of the display panel DP at (e.g., in or on) the single-layer area SLA, a portion of the first multi-layered area DLA1, and a portion of the second multi-layered area DLA2.

According to one or more embodiments of the present disclosure, each of the first, second, and third sensing lines TL-1, TL-2, and TL-3 described above with reference to FIG. 5 may include a first trace line CDL1 and a second trace line CDL2. The first trace line CDL1 may be included in the first sensing conductive layer TML1 described above with reference to FIG. 4, and the second trace line CDL2 may be included in the second sensing conductive layer TML2 described above with reference to FIG. 4.

Each of the first, second, third, and fourth lines TL1, TL2, TL3, and TL4 may include the trace lines that are disposed at (e.g., in or on) different layers from each other in the first and second multi-layered areas DLA1 and DLA2. As an example, the first line TL1 may include a first-first trace line CDL1-1 disposed on the first sensing insulating layer TIL1, and a second-first trace line CDL2-1 connected to and overlapping with the first-first trace line CDL1-1 in the first multi-layered area DLA1. The first line TL1 may include a first-first' trace line CDL1-1' disposed on the first sensing insulating layer TIL1, and a second-first' trace line CDL2-1' connected to and overlapping with the first-first' trace line CDL1-1' in the second multi-layered area DLA2.

The second line TL2 may include a first-second trace line CDL1-2 disposed on the first sensing insulating layer TIL1, and a second-second trace line CDL2-2 connected to and overlapping with the first-second trace line CDL1-2 in the first multi-layered area DLA1. The second line TL2 may include a first-second' trace line CDL1-2' disposed on the first sensing insulating layer TIL1, and a second-second' trace line CDL2-2' connected to and overlapping with the first-second' trace line CDL1-2' in the second multi-layered area DLA2.

The first, second, third, and fourth lines TL1, TL2, TL3, and TL4 may include one of the first trace line CDL1 or the second trace line CDL2 in the single-layer area SLA. According to an embodiment, the single-layer area SLA may include a first area A1 and a second area A2. According to an embodiment, the first area A1 may be connected to the first multi-layered area DLA1 of the first and second sensing lines TL-1 and TL-2, and the second area A2 may be connected to the second multi-layered area DLA2 of the first and second sensing lines TL-1 and TL-2.

As an example, in the first area A1, the first line TL1 may include the first-first trace line CDL1-1, the second line TL2 may include the second-second trace line CDL2-2, the third line TL3 may include a first-third trace line CDL1-3, and the fourth line TL4 may include a second-fourth trace line CDL2-4. In other words, the first line TL1 and the third line TL3 may include the first trace line CDL1 in the first area A1, and the second line TL2 and the fourth line TL4 may include the second trace line CDL2 in the first area A1.

In the second area A2, the first line TL1 may include the second-first' trace line CDL2-1', the second line TL2 may include the first-second' trace line CDL1-2', the third line TL3 may include a second-third' trace line CDL2-3', and the fourth line TL4 may include a first-fourth' trace line CDL1-4'. In other words, unlike the first area A1, the first line TL1 and the third line TL3 may include the second trace line CDL2 in the second area A2, and the second line TL2 and the fourth line TL4 may include the first trace line CDL1 in the second area A2.

According to an embodiment, the first and second sensing lines TL-1 and TL-2 may include a connection area CNA disposed between the first area A1 and the second area A2. In the connection area CNA, the first trace line CDL1 and the second trace line CDL2 may be disposed to overlap with each other when viewed in a plane (e.g., in a plan view). A single-layer contact hole CNT-S may be defined through the second sensing insulating layer TIL2 in the connection area CNA, and thus, the first trace line CDL1 and the second trace line CDL2 may be electrically connected to each other.

FIG. 6B is a cross-sectional view showing the first line TL1 viewed in the direction in which the first line TL1 extends. Hereinafter, the areas in which the first and second trace lines CDL1 and CDL2 included in the first line TL1 are arranged, and a connection relationship between the first and second trace lines CDL1 and CDL2 included in the first line TL1 will be described in more detail.

Referring to FIG. 6B, the first line TL1 may include the first-first trace line CDL1-1 and the second-first trace line CDL2-1, which are disposed to overlap with each other in the first multi-layered area DLA1. The second-first trace line CDL2-1 may be disconnected at a boundary between the first multi-layered area DLA1 and the first area A1, but the first-first trace line CDL1-1 may extend through the first area A1 to the connection area CNA, and may be disconnected at a boundary between the connection area CNA and the second area A2. In other words, only the first-first trace line CDL1-1 may be disposed in the first area A1 for the first line TL1.

The first line TL1 may include the first-first' trace line CDL1-1' and the second-first' trace line CDL2-1', which are disposed to overlap with each other in the second multi-layered area DLA2. The first-first' trace line CDL1-1' may be disconnected at a boundary between the second multi-layered area DLA2 and the second area A2, but the second-first' trace line CDL2-1' may extend through the second area A2 to the connection area CNA, and may be disconnected at a boundary between the connection area CNA and the first area A1. In other words, only the second-first' trace line CDL2-1' may be disposed in the second area A2 for the first line TL1.

The second-first' trace line CDL2-1' and the first-first trace line CDL1-1 may be electrically connected to each other via the single-layer contact hole CNT-S defined (e.g., penetrating) through the second sensing insulating layer TIL2 in the connection area CNA. The first-first' trace line CDL1-1' and the second-first' trace line CDL2-1' may be electrically connected to each other via a multi-layered contact hole CNT-D defined (e.g., penetrating) through the second sensing insulating layer TIL2 in the second multi-layered area DLA2.

Accordingly, in the case of the first line TL1 in the single-layer area SLA, a signal may be transmitted via the first trace line CDL1 in the first area A1, and the signal may be transmitted via the second trace line CDL2 in the second area A2, the second trace line CDL2 being connected to the first trace line CDL1 of the first area A1.

FIG. 6C is a cross-sectional view showing the second line TL2 viewed in the direction in which the second line TL2 extends. Hereinafter, the areas in which the first and second trace lines CDL1 and CDL2 included in the second line TL2 are arranged, and a connection relationship between the first and second trace lines CDL1 and CDL2 included in the second line TL2 will be described in more detail.

Referring to FIG. 6C, the second line TL2 may include the first-second trace line CDL1-2 and the second-second trace line CDL2-2, which are disposed to overlap with each other in the first multi-layered area DLA1. The first-second trace line CDL1-2 may be disconnected at a boundary between the first multi-layered area DLA1 and the first area A1, but the second-second trace line CDL2-2 may extend through the first area A1 to the connection area CNA, and may be disconnected at a boundary between the connection area CNA and the second area A2. In other words, only the second-second trace line CDL2-2 may be disposed in the first area A1 for the second line TL2.

The second line TL2 may include the first-second' trace line CDL1-2' and the second-second' trace line CDL2-2', which are disposed to overlap with each other in the second multi-layered area DLA2. The second-second' trace line CDL2-2' may be disconnected at a boundary between the second multi-layered area DLA2 and the second area A2, but the first-second' trace line CDL1-2' may extend through the second area A2 to the connection area CNA, and may be disconnected at a boundary between the connection area CNA and the first area A1. In other words, only the first-second' trace line CDL1-2' may be disposed in the second area A2 for the second line TL2.

The first-second' trace line CDL1-2' and the second-second trace line CDL2-2 may be electrically connected to each other via the single-layer contact hole CNT-S penetrating (e.g., defined) through the second sensing insulating layer TIL2 in the connection area CNA. The first-second' trace line CDL1-2' and the second-second' trace line CDL2-2' may be electrically connected to each other via the multi-layered contact hole CNT-D penetrating (e.g., defined) through the second sensing insulating layer TIL2 in the second multi-layered area DLA2.

Accordingly, in the case of the second line TL2 in the single-layer area SLA, a signal may be transmitted via the second trace line CDL2 in the first area A1, and the signal may be transmitted via the first trace line CDL1 in the second area A2, the first trace line CDL1 being connected to the second trace line CDL2 of the first area A1.

Accordingly, from among the first trace line CDL1 and the second trace line CDL2, the trace line for transmitting a signal along the first line TL1 in each of the first area A1 and the second area A2, and the trace line for transmitting a signal along the second line TL2 in each of the first area A1 and the second area A2 may be opposite to each other.

The description of the trace lines CDL1-1, CDL1-1', CDL2-1, and CDL2-1' of the first line TL1 with reference to FIG. 6B may be applied in the same or substantially the same manner to the trace lines CDL1-3, CDL1-3', CDL2-3, and CDL2-3' of the third line TL3. In addition, the description of the trace lines CDL1-2, CDL1-2', CDL2-2, and CDL2-2' of the second line TL2 with reference to FIG. 6C may be applied in the same or substantially the same manner to the trace lines CDL1-4, CDL1-4', CDL3-4, and CDL3-4' of the fourth line TL4. Accordingly, redundant description may not be repeated.

Accordingly, the trace line for transmitting a signal in the first area A1 and the trace line for transmitting a signal in the second area A2 may be opposite to each other not only in the first and second lines TL1 and TL2 as described above, but also in any two lines that are adjacent to each other from among the first and second sensing lines TL-1 and TL-2.

FIGS. 6B and 6C show a shape of the single-layer contact hole CNT-S and a shape of the multi-layered contact hole CNT-D as a representative example, and thus, the shape of the single-layer contact hole CNT-S and the shape of the multi-layered contact hole CNT-D are not particularly limited, as long as the first trace line CDL1 and the second trace line CDL2 included in one line from among the first, second, third, and fourth lines TL1, TL2, TL3, and TL4 may be electrically connected to each other. In addition, the shape of the single-layer contact hole CNT-S and the shape of the multi-layered contact hole CNT-D may be different from each other.

Referring again to FIG. 6A, each of the first trace line CDL1 and the second trace line CDL2 overlapping with the connection area CNA from among the first trace line CDL1 and the second trace line CDL2 may include a connection pattern. The connection pattern may have a parallelogram shape. A pair of connection patterns overlapping with each other may be spaced apart from each other in an oblique direction along an extension direction of the connection area CNA. Accordingly, a separation distance between different lines may be reduced, and a width of the single-layer area SLA may be reduced.

However, the shape of the connection area CNA in a plane (e.g., in a plan view) is not limited thereto or thereby, and the shape of the first trace line CDL1 and the shape of the second trace line CDL2 overlapping with the first trace line CDL1 is not particularly limited, as long as the single-layer contact hole CNT-S for connecting the first trace line CDL1 and the second trace line CDL2 may be formed.

According to an embodiment, as shown in FIG. 6A, the connection area CNA may extend obliquely with respect to the direction in which the first or second trace line CDL1 or CDL2 extends in the single-layer area SLA. In a case where the connection area CNA is disposed obliquely, portions of the connection areas that are adjacent to each other from among the connection areas CNA may overlap with each other in the second direction DR2. Accordingly, the connection area CNA may have a smaller width when compared with a case where the connection area CNA extends in a direction that is perpendicular to or substantially perpendicular to the extension direction of the first trace line CDL1 or the second trace line CDL2 in the single-layer area SLA.

According to an embodiment, each of the first, second, third, and fourth lines TL1, TL2, TL3, and TL4 may include a first extension portion EP1, a second extension portion EP2, and an inclination portion SP in the first area A1. The first extension portion EP1 may extend in the second direction DR2, and one end of the first extension portion EP1 may be connected to the first multi-layered area DLA1. The second extension portion EP2 may extend in the second direction DR2, and one end of the second extension portion EP2 may be connected to the connection area CNA. The inclination portion SP may be disposed between the first extension portion EP1 and the second extension portion EP2, and may extend in an oblique direction with respect to the second direction DR2. The oblique direction may be a direction that crosses the extension direction of the connection area CNA. As the portions of the first, second, third, and fourth lines TL1, TL2, TL3, and TL4 extend along the oblique direction in the first area A1, the second-second trace line CDL2-2 of the second line TL2 included in the first extension portion EP1 and the second-first' trace line CDL2-1' of the first line TL1 included in the second area A2 may be aligned with each other in the second direction DR2.

According to an embodiment, a line transition area may be defined as an area between one end of the connection area CNA connected to the second area A2 of the first line TL1 and one end of the inclination portion SP adjacent to the first extension portion EP1 of the first line TL1. The inclination portion SP may be defined in the vicinity of the connection area CNA, and a width W-CN in the second direction DR2 of the line transition area may be smaller than a length of the first area A1 and a length of the second area A2 of each of the first, second, third, and fourth lines TL1, TL2, TL3, and TL4. As an example, in a case where each of a length L1 of the first area A1 and a length L2 of the second area A2 (e.g., refer to FIG. 6B) is about 4.2 millimeters, the width W-CN of the line transition area may be about 0.7 millimeters. Accordingly, the width in the first direction DR1, which increases due to the connection area CNA, may be reduced by the inclination portion SP adjacent to the connection area CNA, and thus, an increase in the width that may be caused by the connection area CNA may be reduced.

FIG. 6A shows a structure in which each of the single-layer contact holes CNT-S included in the first, second, third, and fourth lines TL1, TL2, TL3, and TL4, and the multi-layered contact holes CNT-D included in the first, second, third, and fourth lines TL1, TL2, TL3, and TL4 are arranged in the oblique direction with respect to the second direction DR2 as a representative example. However, the arrangement of the single-layer contact holes CNT-S and the multi-layered contact holes CNT-D are not particularly limited thereto or thereby.

FIG. 7A is a cross-sectional view showing the first, second, third, and fourth lines TL1, TL2, TL3, and TL4 in the first area A1 when viewed in the second direction DR2. FIG. 7B is a cross-sectional view showing the first, second, third, and fourth lines TL1, TL2, TL3, and TL4 in the second area A2 when viewed in the second direction DR2.

Referring to FIG. 7A, when viewed in the cross-section, the first trace lines CDL1-1 and CDL1-3 and the second trace lines CDL2-2 and CDL2-4 may be alternately arranged with each other in the first area A1.

According to an embodiment, each of the first trace lines CDL1-1 and CDL1-3 and each of the second trace lines CDL2-2 and CDL2-4 disposed in the first area A1 may have a trapezoidal shape in the cross-section.

As an example, each of the first trace lines CDL1-1 and CDL1-3 disposed in the first area A1 may include a first lower surface LS1 that makes contact with the first sensing insulating layer TIL1, and a first upper surface US1 opposite the first lower surface LS1. The first lower surface LS1 may have a width greater than a width of the first upper surface US1, and the first upper surface US1 may entirely overlap with the first lower surface LS1.

Each of the second trace lines CDL2-2 and CDL2-4 disposed in the first area A1 may include a second lower surface LS2 that makes contact with the second sensing insulating layer TIL2, and a second upper surface US2 opposite to the second lower surface LS2. The second lower surface LS2 may have a width greater than a width of the second upper surface US2, and the second upper surface US2 may entirely overlap with the second lower surface LS2.

When viewed in the cross-section, the width of the first lower surface LS1 of the first trace lines CDL1-1 and CDL1-3 disposed in the first area A1 is referred to as a first width W1, and the width of the second lower surface LS2 of the second trace lines CDL2-2 and CDL2-4 disposed in the first area A1 is defined as a second width W2. According to an embodiment, the first width W1 may be the same or substantially the same as the second width W2 in the first area A1.

A thickness of the first trace lines CDL1-1 and CDL1-3 disposed in the first area A1 in a direction toward the first upper surface US1 from the first lower surface LS1 is referred to as a first thickness T1, and a thickness of the second trace lines CDL2-2 and CDL2-4 disposed in the first area A1 in a direction toward the second upper surface US2 from the second lower surface LS2 is referred to as a second thickness T2. According to an embodiment, the first thickness T1 may be the same or substantially the same as the second thickness T2 in the first area A1.

According to an embodiment, as shown in FIG. 7A, an end of the first lower surface LS1 of the first-first trace line CDL1-1 of the first line TL1 in the first area A1 may be aligned with an end of the second lower surface LS2 of the second-second trace line CDL2-2 of the second line TL2 in the direction toward the first upper surface US1 from the first lower surface LS1 (e.g., on the plane, or in a plan view).

Each of the first, second, third, and fourth lines TL1, TL2, TL3, and TL4 may include both the first and second trace lines CDL1 and CDL2 overlapping with each other in the multi-layered areas DLA1, DLA2, and DLA3 (e.g., refer to FIGS. 5 and 6A), and thus, the first, second, third, and fourth lines TL1, TL2, TL3, and TL4 may be arranged to be spaced apart from each other by a suitable separation distance (e.g., a predetermined separation distance) to reduce an interference therebetween.

Further, each of the first, second, third, and fourth lines TL1, TL2, TL3, and TL4 may include only one trace line from among the first trace line CDL1 and the second trace line CDL2 in the first area A1, and the first trace line CDL1 and the second trace line CDL2 may be alternately arranged with each other. Accordingly, the first, second, third, and fourth lines TL1, TL2, TL3, and TL4 may be arranged with no separation distance therebetween on the plane (e.g., in a plan view). Therefore, the same number of first and second sensing lines TL-1 and TL-2 may be arranged in a relatively narrower width, and the first and second sensing lines TL-1 and TL-2 may be arranged in a narrow space, and thus, the width of the bezel area of the display device DD may be reduced.

Referring to FIG. 7B, when viewed in the cross-section, the first trace lines CDL1-2' and CDL1-4' may be alternately arranged with the second trace lines CDL2-1' and CDL2-3' in the second area A2.

In the cross-section, a shape of the first trace lines CDL1-2' and CDL1-4' disposed in the second area A2 and a shape of the second trace lines CDL2-1' and CDL2-3' disposed in the second area A2 may be the same or substantially the same as the shape of the first trace lines CDL1-1 and CDL1-3 disposed in the first area A1 and the shape of the second trace lines CDL2-2 and CDL2-4 disposed in the first area A1. In other words, each of the first trace lines CDL1-2' and CDL1-4' and each of the second trace lines CDL2-1' and CDL2-3' may have a trapezoidal shape. In this case, the first lower surface LS1 and the second lower surface LS2 may have a width greater than that of the first upper surface US1 and the second upper surface US2, respectively, and the first upper surface US1 and the second upper surface US2 may entirely overlap with the first lower surface LS1 and the second lower surface LS2, respectively.

In addition, a first width W1 of each of the first trace lines CDL1-2' and CDL1-4' disposed in the second area A2 may be the same or substantially the same as the first width W1 of the first trace lines CDL1-1 and CDL1-3 disposed in the first area A1, and a second width W2 of each of the second trace lines CDL2-1' and CDL2-3' disposed in the second area A2 may be the same or substantially the same as the second width W2 of the second trace lines CDL2-2 and CLD2-4 in the first area A1.

A first thickness T1 of each of the first trace lines CDL1-2' and CDL1-4' disposed in the second area A2 may be the same or substantially the same as the first thickness T1 of the first trace lines CDL1-1 and CDL1-3 disposed in the first area A1, and a second thickness T2 of each of the second trace lines CDL2-1' and CDL2-3' disposed in the second area A2 may be the same or substantially the same as the second thickness T2 of the second trace lines CDL2-2 and CLD2-4 in the first area A1.

In addition, when viewed in the cross-section, an end of the first lower surface LS1 of the first trace lines CDL1-2' and CDL1-4' disposed in the second area A2 may be aligned with an end of the second lower surface LS2 of the second trace lines CDL2-1' and CDL2-3' disposed in the second area A2 in the third direction DR3.

According to the present embodiment, the first trace line CDL1 and the second trace line CDL2 may be disposed on different layers from each other, and etching processes for the first trace line CDL1 and the second trace line CDL2 may be performed separately from each other. Accordingly, an error with regards to the width between the first trace lines that are adjacent to each other from among the first trace lines CDL1, which may occur after the etching process, and an error with regards to the width between the second trace lines that are adjacent to each other from among the second trace lines CDL2, which may occur after the etching process, may be different from each other. In other words, the error of a critical dimension (CD) value, which may refer to the width between the lines that are adjacent to each other, in the first trace line CDL1 may be different from that in the second trace line CDL2. Further, an error with regards to the thickness of the first trace line CDL1, which may occur after the etching process, may be different from an error with regards to the thickness of the second trace line CDL2, which may occur after the etching process.

Accordingly, in a case where the first and second sensing lines TL-1 and TL-2 include only one trace line from among the first trace line CDL1 and the second trace line CDL2 in the single-layer area SLA, each of the error occurring in the first trace line CDL1 and the error occurring in the second trace line CDL2 may correspond to specific lines. Therefore, a variation in a mutual capacitance value due to the etching error may correspond to the specific lines, and thus, a difference in the mutual capacitance value may be caused between the lines.

On the other hand, according to one or more embodiments of the present disclosure, the single-layer area SLA may be applied to the first area A1 and the second area A2, and the trace line of the sensing lines in the first area A1 may be opposite to the trace line of the sensing lines in the second area A2. Accordingly, the variation in the mutual capacitance value due to the error may be prevented or substantially prevented from being concentrated on the specific lines. Therefore, as both of the first and second sensing lines TL-1 and TL-2 are affected by the error occurring in the first trace line CDL1 and the error occurring in the second trace line CDL2, the difference in the mutual capacitance value between the first and second sensing lines TL-1 and TL-2 may be reduced. Accordingly, it may be possible to prevent or substantially prevent the touch sensing accuracy from being varied depending on the areas, and a sensing malfunction may be reduced. Thus, the sensing reliability of the display device DD (e.g., refer to FIG. 1A) may be improved.

In more detail, in a case where the length L1 of the first area A1 and the length L2 of the second area A2 of each of the first and second sensing lines TL-1 and TL-2 are the same or substantially the same as each other, the difference in the mutual capacitance value, which may be caused by the difference between the error occurring in the first trace line CDL1 and the error occurring in the second trace line CDL2, may be reduced.

Figure 8:
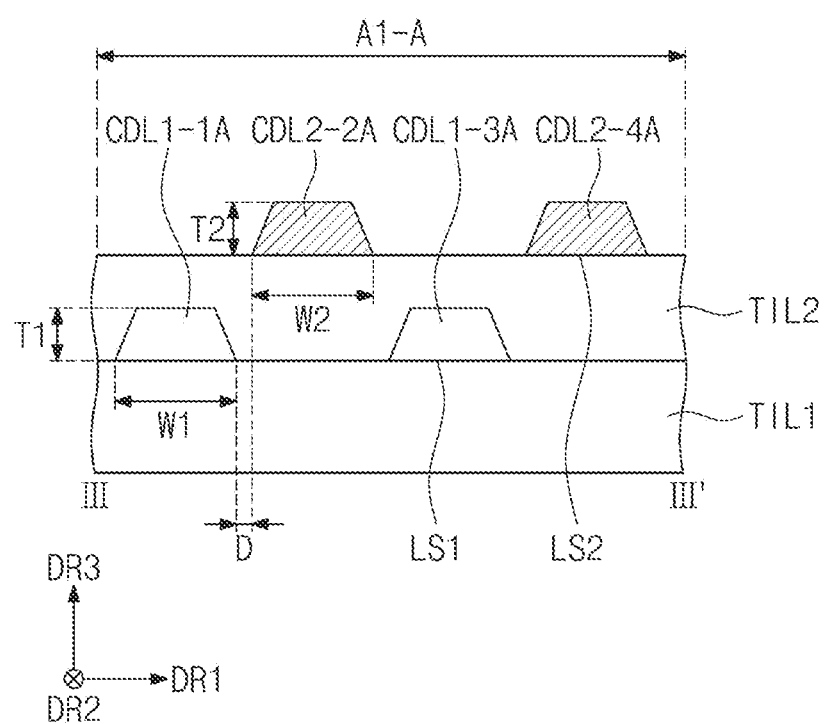
FIG. 8 is a cross-sectional view showing portions of sensing lines according to an embodiment of the present disclosure.

FIG. 8 shows a cross-section of a portion of sensing lines according to an embodiment of the present disclosure. FIG. 8 shows a cross-section of the sensing lines when viewed in a direction (e.g., the second direction DR2) in which the first, second, third, and fourth lines TL1, TL2, TL3, and TL4 (e.g., refer to FIG. 5) extend in a first area A1-A. In FIG. 8, the same/similar reference symbols are used to denote the same/similar elements described above with reference to FIG. 7A, and thus, redundant description thereof may be simplified or may not be repeated.

According to an embodiment, an end of a first lower surface LS1 of a first-first trace line CDL1-1A included in the first line TL1 in the first area A1-A may be spaced apart by a suitable separation distance (e.g., a predetermined separation) distance D from an end of a second lower surface LS2 of a second-second trace line CDL2-2A included in the second line TL2 in a direction (e.g., the first direction DR1) that is perpendicular to or substantially perpendicular to a direction (e.g., the second direction DR2) in which the first and second lines TL1 and TL2 extend. In other words, when viewed in a plane (e.g., in a plan view), the first-first trace line CDL1-1A and the second-second trace line CDL2-2A may be disposed to be spaced apart from each other by the separation distance D.

The separation distance D may be caused by etching errors of each of the first trace lines CDL1-1A and CDL1-3A and the second trace lines CDL2-2A and CDL2-4A, even though ends of the first trace lines CDL1-1A and CDL1-3A disposed in the first area A1-A and ends of second trace lines CDL2-2A and CDL2-4A disposed in the first area A1-A are set to be aligned with each other in third direction DR3 during an etching process. In addition, the separation distance D may be caused by setting the separation distance D during the etching process, and in this case, the first trace lines CDL1-1A and CDL1-3A may be prevented or substantially prevented from overlapping with the second trace lines CDL2-2A and CDL2-4A after the etching process.

According to an embodiment, the separation distance D in the first direction DR1 may be equal to or smaller than about 2 micrometers. When the separation distance D in the first direction DR1 is greater than about 2 micrometers, it may be difficult to arrange the first and second sensing lines TL-1 and TL-2 in the area having a narrow width.

The separation distance D may be applied to the first and second trace lines in the second area A2 (e.g., refer to FIG. 6A).

Figure 9A:
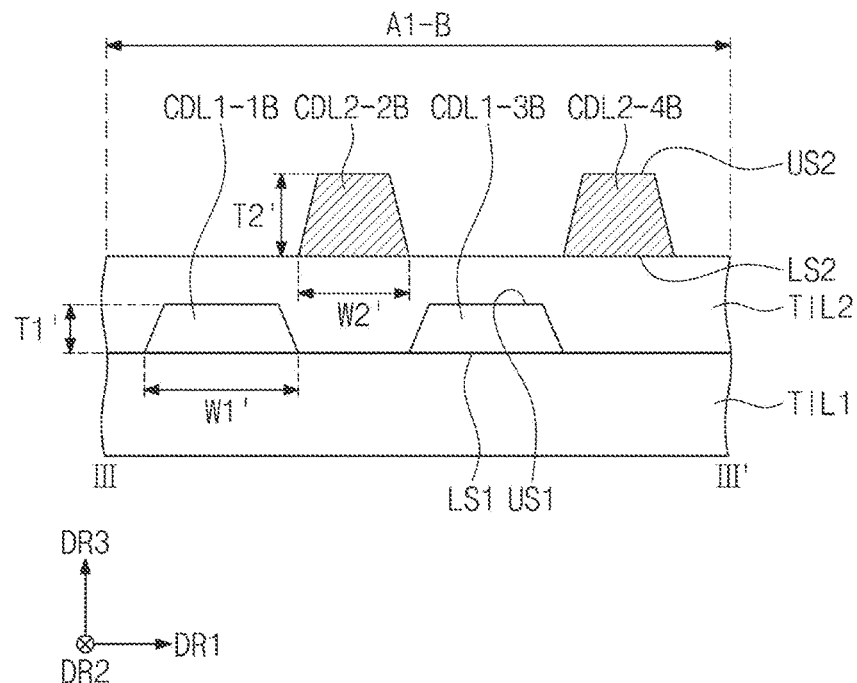
FIG. 9A is a cross-sectional view showing a portion of a first area of sensing lines according to an embodiment of the present disclosure.
Figure 9B:
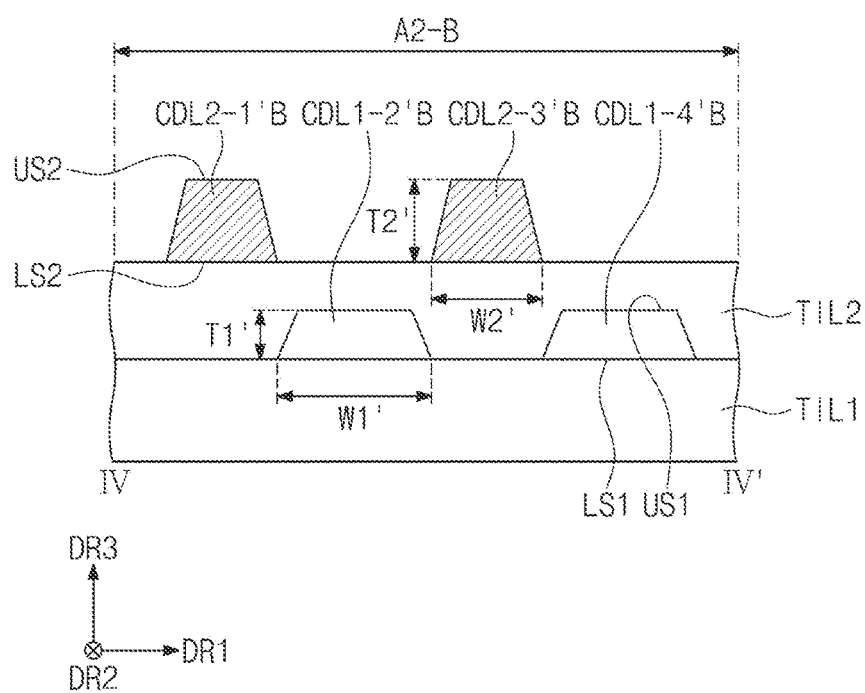
FIG. 9B is a cross-sectional view showing a portion of a second area of sensing lines according to an embodiment of the present disclosure.

FIG. 9A is a cross-sectional view showing a portion of a first area A1-B of sensing lines according to an embodiment of the present disclosure. FIG. 9B is a cross-sectional view showing a portion of a second area A2-B of sensing lines according to an embodiment of the present disclosure. FIG. 9A shows a cross-section of the sensing lines when viewed in a direction (e.g., the second direction DR2) in which the first, second, third, and fourth lines TL1, TL2, TL3, and TL4 (e.g., refer to FIG. 5) extend in the first area A1-B. FIG. 9B shows a cross-section of the sensing lines when viewed in a direction (e.g., the second direction DR2) in which the first, second, third, and fourth lines TL1, TL2, TL3, and TL4 (e.g., refer to FIG. 5) extend in the second area A2-B. In FIGS. 9A and 9B, the same/similar reference symbols are used to denote the same/similar elements described above with reference to FIGS. 5 to 7A, and thus, redundant description thereof may be simplified or may not be repeated.

Referring to FIG. 9A, a first width W1' of first trace lines CDL1-1B and CDL1-3B may have a value different from a value of a second width W2' of second trace lines CDL2-2B and CDL2-4B in the first area A1-B. In addition, a first thickness T1' of the first trace lines CDL1-1B and CDL1-3B may have a value different from a value of a second thickness T2' of the second trace lines CDL2-2B and CDL2-4B.

As an example, the first width W1' may be greater than the second width W2' in the first area A1-B, and the first thickness T1' may be smaller than the second thickness T2' in the first area A1-B. In this case, a ratio of the first width W1' to the second width W2' and a ratio of the first thickness T1' to the second thickness T2' may have an inverse relationship with each other. Accordingly, the first, second, third, and fourth lines TL1, TL2, TL3, and TL4 may have the same or substantially the same resistance value as each other, and deterioration in the sensing accuracy of the input sensor ISL (e.g., refer to FIG. 5), which may be caused by a difference in resistance between the sensing lines, may be prevented or reduced.

According to an embodiment, an end of a first lower surface LS1 of the first trace line CDL1-1B of the first line TL1 may be aligned with an end of a second lower surface LS2 of the second trace line CDL2-2B of the second line TL2 in a direction toward a first upper surface US1 from the first lower surface LS1 (e.g., the third direction DR3). Accordingly, in the first area A1-B, a width between the first trace lines that are adjacent to each other from among the first trace lines may be the same or substantially the same as the second width W2', and a width between the second trace lines that are adjacent to each other from among the second trace lines may be the same or substantially the same as the first width W1'.

Referring to FIG. 9B, in the second area A2-B, first trace lines CDL1-2'B and CDL1-4'B may have a first width W1', and second trace lines CDL2-1'B and CDL2-3'B may have a second width W2' smaller than the first width W1'. In addition, the first trace lines CDL1-2'B and CDL1-4'B may have a first thickness T1', and the second trace lines CDL2-1'B and CDL2-3'B may have a second thickness T2' greater than the first thickness T1'.

In addition, similar to the first area A1-B, an end of a first lower surface LS1' of a first-second' trace line CDL1-2'B of the first line TL1 may be aligned with an end of a second lower surface LS2' of a second-first' trace line CDL2-1'B of the second line TL2 in the third direction DR3 in the second area A2-B.

According to an embodiment, the first trace lines CDL1-1B and CDL1-3B disposed in the first area A1-B and the first trace lines CDL1-2'B and CDL1-4'B disposed in the second area A2-B may have the same or substantially the same width W1', and the same or substantially the same thickness T1'. The second trace lines CDL2-2B and CDL2-4B disposed in the first area A1-B and the second trace lines CDL2-1'B and CDL2-3'B disposed in the second area A2-B may have the same or substantially the same width W2', and the same or substantially the same thickness T2'.

Figure 10:
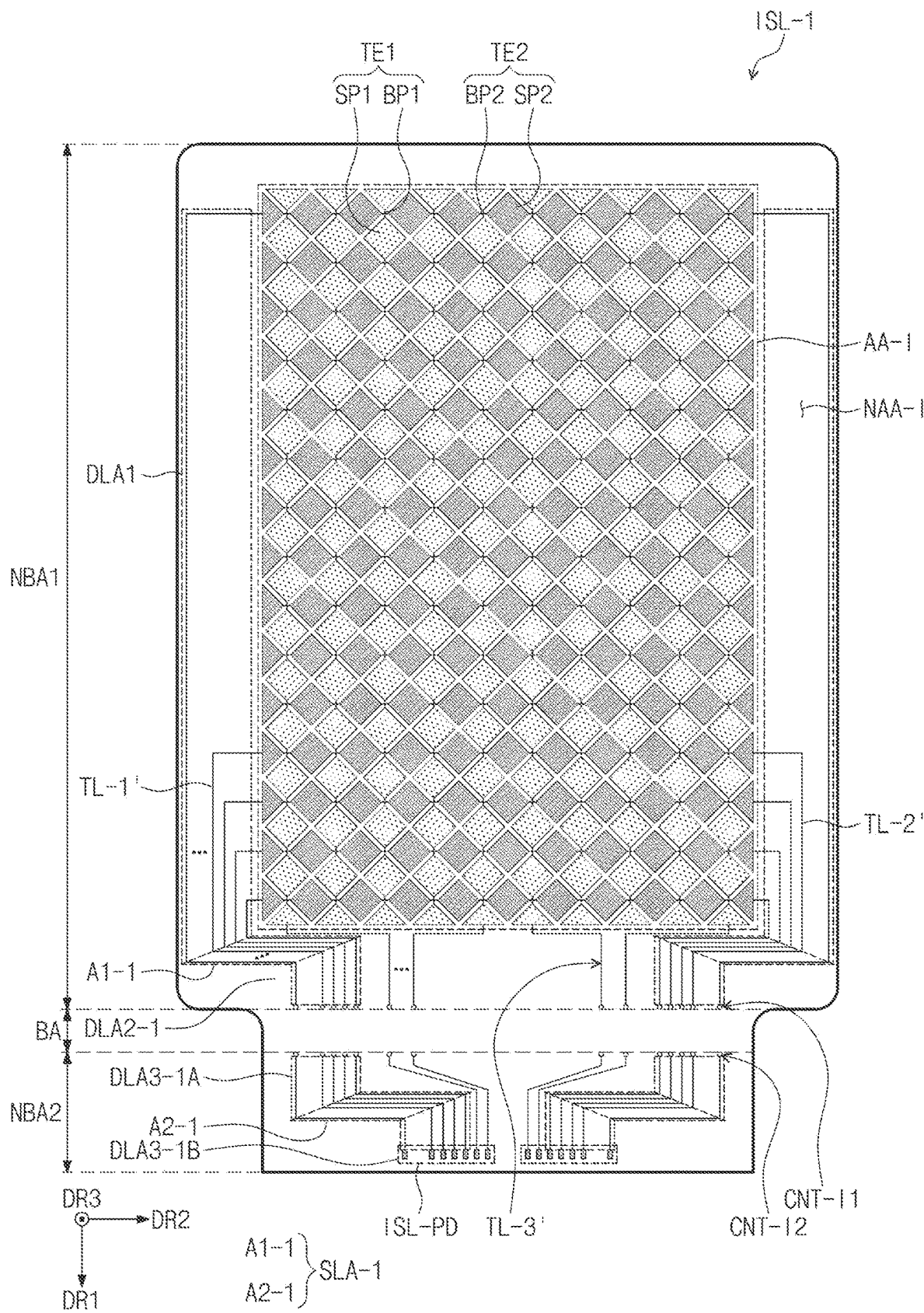
FIG. 10 is a plan view showing an input sensor according to an embodiment of the present disclosure.

FIG. 10 is a plan view showing an input sensor ISL-1 according to an embodiment of the present disclosure. The input sensor ISL-1 shown in FIG. 10 may be different from the input sensor ISL described above with reference to FIG. 5. In FIG. 10, the same/similar reference symbols are used to denote the same/similar elements described above with reference to FIGS. 1A to 9, and thus, redundant description thereof may be simplified or may not be repeated.

According to an embodiment, a first area A1-1 and a second area A2-1 of a single-layer area SLA-1 may be disposed in different areas from each other. As an example, the first area A1-1 may be disposed to overlap with a first non-bending area NBA1 of a display panel DP (e.g., refer to FIG. 3A), and the second area A2-1 may be disposed to overlap with a second non-bending area NBA2 of the display panel DP. In other words, the first area A1-1 and the second area A2-1 may be spaced apart from each other with a bending area BA interposed therebetween.

According to an embodiment, one end of first and second sensing lines TL-1' and TL-2' may be connected to a first multi-layered area DLA1 at (e.g., in or on) the first area A1-1, and the other end of the first and second sensing lines TL-1' and TL-2' may be connected to a second multi-layered area DLA2-1 at (e.g., in or on) the first area A1-1.

According to an embodiment, the first and second sensing lines TL-1' and TL-2' may be connected to third multi-layered areas DLA3-1A and DLA3-1B in the second area A2-1. The third multi-layered areas DLA3-1A and DLA3-1B may include a third-first multi-layered area DLA3-1A in which the first and second sensing lines TL-1' and TL-2' are extended from a second input contact hole CNT-I2, and a third-second multi-layered area DLA3-1B in which the first and second sensing lines TL-1' and TL-2' are connected to input pads of an input pad part ISL-PD. In the second area A2-1, one end of the first and second sensing lines TL-1' and TL-2' may be connected to the third-first multi-layered area DLA3-1A, and the other end of the first and second sensing lines TL-1' and TL-2' may be connected to the third-second multi-layered area DLA3-1B.

According to an embodiment, a length of the first and second sensing lines TL-1' and TL-2' in the first area A1-A may be the same or substantially the same as a length of the first and second sensing lines TL-1' and TL-2' in the second area A2-A. Accordingly, a variation in a mutual capacitance value, which may be caused by etching errors between the first trace line CDL1 and the second trace line CDL2, may be reduced.

FIG. 10 shows a structure in which the first and second sensing lines TL-1' and TL-2' extend in the second direction DR2, and are arranged along the first direction DR1 in the first area A1-1 and the second area A2-1 as a representative example, but the present disclosure is not limited thereto or thereby. Each of the first and second sensing lines TL-1' and TL-2' may extend in an oblique direction in the single-layer area SLA-1, and may extend to fit a shape of a portion where the space for the arrangement of the first and second sensing lines TL-1' and TL-2' is insufficient.

In addition, FIG. 10 shows a structure in which the third multi-layered areas DLA3-A1 and DLA3-A2 are defined in an area overlapping with the second non-bending area NBA2 of the display panel DP as a representative example, but the present disclosure is not limited thereto or thereby. The first and second sensing lines TL-1' and TL-2' may include only the second area A2-1 in the area overlapping with the second non-bending area NBA2, or may include one third multi-layered area and the second area A2-1.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
    a display panel comprising a pixel; and
    an input sensor on the display panel, the input sensor comprising:
        sensing electrodes; and
        sensing lines comprising:
            a multi-layered area comprising a first trace line and a second trace line, the first and second trace lines being connected to the sensing electrodes and located at different layers from each other;
            a single-layer area comprising a first area and a second area;
            a first line comprising the first trace line in the first area, and the second trace line connected to the first trace line in the second area; and
            a second line adjacent to the first line, the second line comprising the second trace line in the first area, and the first trace line connected to the second trace line in the second area.

2. The display device of claim 1, wherein a length of the first line in the first area is equal to a length of the first line in the second area, and a length of the second line in the first area is equal to a length of the second line in the second area.

3. The display device of claim 1, wherein the display panel comprises:
    a first non-bending area comprising the pixel;
    a bending area; and
    a second non-bending area,
    wherein the first non-bending area, the bending area, and the second non-bending area are arranged along a first direction, and the bending area is configured to be bent relative to an imaginary axis extending in a second direction crossing the first direction.

4. The display device of claim 3, wherein the single-layer area overlaps with the first non-bending area.

5. The display device of claim 4, wherein the sensing lines further comprise a connection area connecting the first area and the second area to each other, and the first trace line overlaps with the second trace line in the connection area.

6. The display device of claim 5, wherein portions of the first trace line and the second trace line that overlap with each other in the connection area each have a parallelogram shape.

7. The display device of claim 5, wherein at the connection area, the first trace line of the first line in the first area is connected to the second trace line of the first line in the second area.

8. The display device of claim 7, wherein at the connection area, the second trace line of the second line in the first area is connected to the first trace line of the second line in the second area.

9. The display device of claim 5, wherein the connection area extends in an oblique direction with respect to a direction in which the first and second lines extend in the second area.

10. The display device of claim 9, wherein each of the first and second trace lines comprises:
    a first extension portion extending in one direction, and connected to the multi-layered area in the first area;
    a second extension portion extending in the one direction, and connected to the connection area in the first area; and
    an inclination portion extending in an oblique direction with respect to the one direction, and located between the first extension portion and the second extension portion, wherein the first extension portion of the second line is aligned with the second area of the first line in the one direction.

11. The display device of claim 3, wherein:
sensing lines overlapping with the first area from among the sensing lines overlap with the first non-bending area of the display panel, and
sensing lines overlapping with the second area from among the sensing lines are spaced from the first area with the bending area interposed therebetween, and overlap with the second non-bending area.

12. The display device of claim 11, wherein the display panel comprises:
a bridge line located in the bending area;
a first input contact hole exposing one end of the bridge line adjacent to the first non-bending area; and
a second input contact hole exposing another end of the bridge line adjacent to the second non-bending area, and
wherein the sensing lines overlapping with the first area are connected to the one end of the bridge line via the first input contact hole, and the sensing lines overlapping with the second area are connected to the other end of the bridge line via the second input contact hole.

13. The display device of claim 3, wherein the first area overlaps with the first non-bending area, and at least a portion of the first area does not overlap with the bending area in the first direction.

14. The display device of claim 3, wherein the multi-layered area comprises a plurality of multi-layered areas, and the single-layer area is located between the plurality of multi-layered areas.

15. The display device of claim 1, wherein the input sensor comprises:
a first sensing insulating layer on the display panel;
a first sensing conductive layer on the first sensing insulating layer, and comprising the first trace line;
a second sensing insulating layer on the first sensing insulating layer to cover the first sensing conductive layer; and
a second sensing conductive layer on the second sensing insulating layer, and comprising the second trace line.

16. The display device of claim 15, wherein each of the first trace line and the second trace line has a trapezoidal shape in a cross-sectional view.

17. The display device of claim 1, wherein the first trace line of the first line does not overlap with the second trace line of the second line in the first area, and the second trace line of the first line does not overlap with the first trace line of the second line in the second area.

18. The display device of claim 17, wherein a distance between the first trace line of the first line and the second trace line of the second line in the single-layer area is less than or equal to about 2 micrometers in a cross-sectional view.

19. The display device of claim 17, wherein an end of the first trace line of the first line is aligned with an end of the second trace line of the second line in the single-layer area in a plan view.

20. The display device of claim 17, wherein the first trace line has a width greater than a width of the second trace line in a cross-sectional view, and the first trace line has a thickness smaller than a thickness of the second trace line in the cross-sectional view.

* * * * *